United States Patent
Arai et al.

(10) Patent No.: US 12,104,047 B2
(45) Date of Patent: *Oct. 1, 2024

(54) CURABLE COMPOSITION AND CURED PRODUCT THEREOF

(71) Applicant: DENKA COMPANY LIMITED, Tokyo (JP)

(72) Inventors: Toru Arai, Tokyo (JP); Shota Yamamoto, Tokyo (JP); Hiroaki Nishimura, Tokyo (JP); Azusa Yagi, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/782,000

(22) PCT Filed: Dec. 1, 2020

(86) PCT No.: PCT/JP2020/044700
§ 371 (c)(1),
(2) Date: Jun. 2, 2022

(87) PCT Pub. No.: WO2021/112088
PCT Pub. Date: Jun. 10, 2021

(65) Prior Publication Data
US 2023/0023889 A1 Jan. 26, 2023

(30) Foreign Application Priority Data

Dec. 3, 2019 (JP) .................................. 2019-218685
Dec. 3, 2019 (JP) .................................. 2019-218686
May 20, 2020 (JP) .................................. 2020-088490
May 20, 2020 (JP) .................................. 2020-088491
May 20, 2020 (JP) .................................. 2020-088492
May 20, 2020 (JP) .................................. 2020-088493

(51) Int. Cl.
| | |
|---|---|
| *C08L 23/08* | (2006.01) |
| *B32B 7/12* | (2006.01) |
| *B32B 15/082* | (2006.01) |
| *B32B 15/085* | (2006.01) |
| *B32B 15/20* | (2006.01) |
| *B32B 17/10* | (2006.01) |
| *B32B 27/08* | (2006.01) |
| *B32B 27/32* | (2006.01) |
| *C08F 210/02* | (2006.01) |
| *C08F 212/08* | (2006.01) |
| *C08F 212/36* | (2006.01) |
| *C08K 5/14* | (2006.01) |
| *C08L 25/08* | (2006.01) |

(52) U.S. Cl.
CPC ............ *C08L 23/0838* (2013.01); *B32B 7/12* (2013.01); *B32B 15/082* (2013.01); *B32B 15/085* (2013.01); *B32B 15/20* (2013.01); *B32B 17/10* (2013.01); *B32B 27/08* (2013.01); *B32B 27/322* (2013.01); *C08F 210/02* (2013.01); *C08F 212/08* (2013.01); *C08F 212/36* (2013.01); *C08K 5/14* (2013.01); *C08L 25/08* (2013.01); *B32B 2307/204* (2013.01); *B32B 2307/206* (2013.01); *B32B 2307/54* (2013.01); *B32B 2307/732* (2013.01); *B32B 2307/748* (2013.01); *B32B 2311/12* (2013.01); *B32B 2323/04* (2013.01); *B32B 2325/00* (2013.01)

(58) Field of Classification Search
None
See application file for complete search history.

(56) References Cited

U.S. PATENT DOCUMENTS

| | | | |
|---|---|---|---|
| 6,265,493 B1 | 7/2001 | Chung et al. | |
| 6,500,535 B1 | 12/2002 | Yamada et al. | |
| 6,559,234 B1 * | 5/2003 | Arai | C08J 9/06 526/170 |

(Continued)

FOREIGN PATENT DOCUMENTS

| | | |
|---|---|---|
| EP | 4 183 843 A1 | 5/2023 |
| JP | S52-031272 B2 | 8/1977 |

(Continued)

OTHER PUBLICATIONS

Aria—JP 2010-280860 A—sister of Euro D1—MT—copolymer cured with filler—2010 (Year: 2010).*

(Continued)

*Primary Examiner* — John Vincent Lawler

(74) *Attorney, Agent, or Firm* — Oliff PLC

(57) ABSTRACT

A curable composition includes an olefin-aromatic vinyl compound-aromatic polyene copolymer satisfying conditions (1) to (4) and an additive resin, which is at least one of a hydrocarbon-based elastomer, polyphenylene ether, olefin-aromatic vinyl compound-aromatic polyene copolymerized oligomer, and aromatic polyene-based resin. (1) The number average molecular weight of the copolymer is 5000 to 100000. (2) The aromatic vinyl compound monomer has 8 to 20 carbon atoms, and the content of the unit of the monomer is 0 to 70 mass %. (3) The aromatic polyene is selected from polyenes having 5 to 20 carbon atoms and a plurality of vinyl and/or vinylene groups in the molecule, and the content of the groups is 1.5 to 20 pieces per number average molecular weight. (4) The olefin is selected from olefins having 2 to 20 carbon atoms, and the total monomer units of the olefin, aromatic vinyl compound, and aromatic polyene is 100 mass %.

15 Claims, No Drawings

(56) References Cited

U.S. PATENT DOCUMENTS

| | | | |
|---|---|---|---|
| 9,439,303 | B2 | 9/2016 | Onodera et al. |
| 2004/0039127 | A1 | 2/2004 | Amou et al. |
| 2009/0263604 | A1 | 10/2009 | Arai et al. |
| 2010/0129676 | A1 | 5/2010 | Fujimoto et al. |
| 2016/0212845 | A1 | 7/2016 | Nakashima et al. |
| 2016/0289437 | A1* | 10/2016 | Kumagai ............... B32B 27/30 |
| 2017/0145135 | A1* | 5/2017 | Arai ...................... C08F 212/00 |
| 2017/0190837 | A1* | 7/2017 | Hsieh ................... H05K 1/0326 |
| 2018/0009195 | A1 | 1/2018 | Takeuchi et al. |
| 2018/0273669 | A1 | 9/2018 | Arai |
| 2020/0157261 | A1* | 5/2020 | Guan .................... B32B 15/082 |
| 2021/0070980 | A1 | 3/2021 | Zeng et al. |
| 2022/0105707 | A1 | 4/2022 | Inoda et al. |

FOREIGN PATENT DOCUMENTS

| | | | | |
|---|---|---|---|---|
| JP | H06-192392 | A | | 7/1994 |
| JP | H11-060645 | A | | 3/1999 |
| JP | 2002/265543 | * | 9/2002 | ............. B32B 27/30 |
| JP | 2003-212941 | A | | 7/2003 |
| JP | 2004-087639 | A | | 3/2004 |
| JP | 2005-089631 | A | | 4/2005 |
| JP | 2006/176708 | * | 7/2006 | ............. C08F 210/02 |
| JP | 2006-176708 | A | | 7/2006 |
| JP | 2008-291227 | A | | 12/2008 |
| JP | 2009/161743 | * | 7/2009 | ............. C08F 210/18 |
| JP | 2009-161743 | A | | 7/2009 |
| JP | 2010/013575 | * | 1/2010 | ............. C08L 53/00 |
| JP | 2010/280771 | * | 12/2010 | ................ C08F 2/44 |
| JP | 2010-280771 | A | | 12/2010 |
| JP | 2010/280860 | * | 12/2010 | ................ C08F 2/44 |
| JP | 2010-280860 | A | | 12/2010 |
| JP | 2011-074187 | A | | 4/2011 |
| JP | 2012-102173 | A | | 5/2012 |
| JP | 5336935 | B2 | | 11/2013 |
| JP | 5481098 | B2 | | 4/2014 |
| JP | 2018-039995 | A | | 3/2018 |
| TW | I590722 | B | | 7/2017 |
| WO | 00/37517 | A1 | | 6/2000 |
| WO | 2015/050080 | A1 | | 4/2015 |
| WO | 2016/114287 | A1 | | 7/2016 |
| WO | 2019/024254 | A1 | | 2/2019 |
| WO | 2019/024255 | A1 | | 2/2019 |
| WO | 2020/153391 | A1 | | 7/2020 |
| WO | 2022/014599 | A1 | | 1/2022 |

OTHER PUBLICATIONS

Suzuki—JP 2002-265543 A—MT—sealant w—copolymer—2002 (Year: 2002).*
Arai—JP 2006-176708 A—MT—copolymer w—up to 3% divinylbenzene—2006 (Year: 2006).*
Arai—JP 2009-161743 A—Euro D1—MT—copolymer low dielectric curing resin—2009 (Year: 2009).*
Aria—JP 2010-280771 A—sister of Euro D2—MT—copolymer low dielectric curing comp—2010 (Year: 2010).*
Suzuki—JP 2010-013575 A—MT—styrene-ethylene-divinylbenzene copolymer—small amounts DVB—2010 (Year: 2010).*
Feb. 16, 2021 Search Report issued in International Patent Application No. PCT/JP2020/044700.
Feb. 2, 2021 Search Report issued in International Patent Application No. PCT/JP2020/044699.
U.S. Appl. No. 17/781,499, filed Jun. 1, 2022 in the name of Toru Arai et al.
May 17, 2022 International Preliminary Report on Patentability issued in International Patent Application No. PCT/JP2020/044700.
May 17, 2022 International Preliminary Report on Patentability issued in International Patent Application No. PCT/JP2020/044699.
Jan. 4, 2023 Extended European Search Report issued in European Patent Application No. 20897253.9.
Jan. 4, 2023 Extended European Search Report issued in Europeant Patent Application No. 22202823.5.
Oct. 10, 2023 Office Action issued in U.S. Appl. No. 17/781,499.
Jan. 20, 2024 Office Action issued in Chinese Patent Application No. 202080082954.5.
May 16, 2024 Notice of Allowance issued in U.S. Appl. No. 17/781,499.
Jan. 24, 2024 Office Action issued in U.S. Appl. No. 17/781,499.

\* cited by examiner

CURABLE COMPOSITION AND CURED PRODUCT THEREOF

TECHNICAL FIELD

The present invention relates to a composition. In the specification, the term "sheet" also includes the concept of a film. Further, the term "film" described in the specification also includes the concept of a sheet.

BACKGROUND ART

Due to the shift of communication frequency to gigahertz bands and frequency bands higher than those, needs for insulating materials having low dielectric properties have increased. Polyolefins such as polyethylene and aromatic vinyl compound polymers such as polystyrene are known as materials exhibiting excellent low dielectric constant and low dielectric tangent due to having no polar groups in molecular structures. However, due to dependence of the heat resistance on the melting point of crystals or the glass transition temperature, they have a problem in the heat resistance as electric insulator, and due to being thermoplastic resins, they have a problem in a film forming process (Patent Literature 1).

Although fluorine-based resins such as perfluoroethylene have characteristics excellent in low dielectric constant, low dielectric loss and heat resistance, device suitability is low due to difficulty in moldability and film formability. In addition, there is a problem in the adhesive strength with a copper foil of wiring. Meanwhile, although substrates and insulating materials using post-curable resins such as epoxy resins, unsaturated polyester resins, polyimide resins, and phenol resins have been widely used due to the heat resistance and easy handling, improvement is required as insulating materials for high frequencies due to relatively high dielectric constants and dielectric losses (Patent Literature 2).

An electrically insulating material including graft or block copolymer including olefin-based and styrene-based polymer segments has been proposed (Patent Literature 3). The material focuses on the low dielectric constant and low dielectric loss essential to olefin-based or styrene-based hydrocarbon polymers. The production method includes general graft polymerization of commercially available polyethylene and polypropylene with a styrene monomer or a divinylbenzene monomer in the presence of a radical polymerization initiator. Such a method has problems of poor graft efficiency and insufficient uniformity of the polymer. Further, the resulting polymer contains a gel, so that there exist problems of poor processability and filling property. The material is a thermoplastic resin having insufficient heat resistance, so that an addition of a heat-resistant resin such as 4-methyl-1-pentene is required. It is difficult to use the material in a molding method including applying the material to a predetermined place or filling a predetermined place with the material and then curing the material.

In Patent Literature 4, an insulating layer including a crosslinked structure containing a hydrocarbon compound having a plurality of aromatic vinyl groups as a cross-linking component is described. The cured product of the cross-linking component specifically described in examples is rigid, so that it is presumed that filling with a large amount of filler is difficult.

In Patent Literature 5, a cured product obtained from a specific polymerization catalyst, including an ethylene-olefin (aromatic vinyl compound)-polyene copolymer having specific composition and formulation and a non-polar vinyl compound copolymer, is shown. Although the cured product specifically described in examples of Patent Literature 5 has characteristics including low dielectric constant and low dielectric tangent, it is extremely soft, so that improvement in mechanical strength such as elastic modulus at normal temperature and high temperature is required. For use as thin film insulating materials such as interlayer insulating materials of FPC and FCCL and coverlay applications, it is preferable to improve stability in dimensions such as thickness during a mounting process or during use after mounting. Further, the cured product of the composition specifically described in examples has room for improvement in adhesion to a metal foil, particularly to a copper foil. In Patent Literature 6, a cured product obtained from the similar specific polymerization catalyst, including an ethylene-olefin (aromatic vinyl compound)-polyene copolymer having specific composition and formulation and a non-polar vinyl compound copolymer is shown. However, the cured product of the composition specifically described in examples has room for improvement in adhesion to a metal foil, particularly to a copper foil, and also in low temperature characteristics. Although a cured product of a composition containing a similar copolymer is also shown in Patent Literature 7, the cured product of the composition specifically described in examples has room for improvement in adhesion to a metal foil, particularly to a copper foil.

In Patent Literature 5, 6, and 7, a cured product obtained from a specific polymerization catalyst, including an ethylene-olefin (aromatic vinyl compound)-polyene copolymer having specific composition and formulation and a non-polar vinyl compound is shown. These curable compositions contain a relatively large amount of monomer components (aromatic vinyl compounds and aromatic polyenes) and are in a varnish form. Therefore, these curable compositions have a problem that a B stage sheet (semi-cured sheet) may not be easily produced in addition to a problem of having an odor. These curable compositions have a problem of complicated production facilities.

CITATION LIST

Patent Literature

Patent Literature 1: Japanese Patent Publication No. 52-31272
Patent Literature 2: Japanese Patent Laid-Open No. 6-192392
Patent Literature 3: Japanese Patent Laid-Open No. 11-60645
Patent Literature 4: Japanese Patent Laid-Open No. 2004-087639
Patent Literature 5: Japanese Patent Laid-Open No. 2010-280771
Patent Literature 6: Japanese Patent Laid-Open No. 2009-161743
Patent Literature 7: Japanese Patent Laid-Open No. 2010-280860

SUMMARY OF INVENTION

Technical Problem

It is desired to provide a thermoplastic composition that may be easily molded and a cured product having excellent low dielectric properties and high mechanical strength (elastic modulus, etc.) at room temperature and high temperature, neither of which has been obtained by the conventional techniques described above.

Solution to Problem

In other words, the present invention may provide the following aspects.

A curable composition comprising an olefin-aromatic vinyl compound-aromatic polyene copolymer satisfying the following conditions (1) to (4) and an additive resin, wherein the additive resin is one or more selected from the group consisting of a hydrocarbon-based elastomer, a polyphenylene ether, an olefin-aromatic vinyl compound-aromatic polyene copolymerized oligomer, and an aromatic polyene-based resin:
(1) The number average molecular weight of the copolymer is 5000 or more and 100000 or less;
(2) The aromatic vinyl compound monomer is an aromatic vinyl compound having 8 or more and 20 or less carbon atoms, and the content of the unit of the aromatic vinyl compound monomer is 0 mass % or more and 70 mass % or less;
(3) The aromatic polyene is one or more selected from polyenes having 5 or more and 20 or less carbon atoms and having a plurality of vinyl groups and/or vinylene groups in the molecule, and the content of the vinyl groups and/or the vinylene groups derived from the unit of the aromatic polyene is 1.5 pieces or more and less than 20 pieces per number average molecular weight; and
(4) The olefin is one or more selected from olefins having 2 or more and 20 or less carbon atoms, and the total of units of the olefin monomer, the aromatic vinyl compound monomer, and the aromatic polyene monomer is 100 mass %.

An electrically insulating material being a cured product obtained from a composition comprising an olefin-aromatic vinyl compound-aromatic polyene copolymer satisfying the following conditions (1) to (4) and an additive resin that is one or more selected from the group consisting of a hydrocarbon-based elastomer, a polyphenylene ether, an olefin-aromatic vinyl compound-aromatic polyene copolymerized oligomer, and an aromatic polyene-based resin, wherein the electrically insulating material has a storage elastic modulus at 300° C. of $5\times10^5$ Pa or more, preferably $1\times10^6$ Pa or more, and a dielectric constant of 2.5 or less and 2.0 or more and a dielectric tangent of 0.003 or less and 0.0005 or more at 23° C. and 10 GHz:
(1) The number average molecular weight of the copolymer is 5000 or more and 100000 or less;
(2) The aromatic vinyl compound monomer is an aromatic vinyl compound having 8 or more and 20 or less carbon atoms, and the content of the aromatic vinyl compound monomer unit is 0 mass % or more and 70 mass % or less;
(3) The aromatic polyene is one or more selected from polyenes having 5 or more and 20 or less carbon atoms and having a plurality of vinyl groups and/or vinylene groups in the molecule, and the content of the vinyl groups and/or the vinylene groups derived from a unit of the aromatic polyene is 1.5 pieces or more and less than 20 pieces per number average molecular weight; and
(4) The olefin is one or more selected from olefins having 2 or more and 20 or less carbon atoms, and the total of units of the olefin monomer, the aromatic vinyl compound monomer, and the aromatic polyene monomer is 100 mass %.

Advantageous Effects of Invention

A curable composition of the present invention has properties as a thermoplastic resin. Further, a cured product obtained by curing the curable composition has excellent low dielectric properties and high mechanical strength (elastic modulus, etc.) at room temperature and high temperature.

DESCRIPTION OF EMBODIMENT

The present invention is described in more detail below. In the present specification, an olefin-aromatic vinyl compound-aromatic polyene copolymer may be simply referred to as a copolymer. Unless otherwise specified, the numerical range in the specification includes the upper limit value and the lower limit value of the range. In the specification, the term "sheet" also includes the concept of a film. Further, the term "film" described in the specification has the same meaning as a sheet. Further, in the specification, a cured product has the same meaning as a cured material. In the specification, a content may be referred to as a content amount.

Compositions

In the specification, a composition (curable composition) may be referred to as a resin composition or a curable resin composition. A composition of the present invention includes the olefin-aromatic vinyl compound-aromatic polyene copolymer having the formulation in the specific range and the molecular weight range. The composition further includes a predetermined amount of one or more "additive resins". Further, the composition may also include a "monomer" and a "curing agent" described later.

Olefin-Aromatic Vinyl Compound-Aromatic Polyene Copolymer (Copolymer of Olefin Monomer, Aromatic Vinyl Compound Monomer, and Aromatic Polyene Monomer)

Methods for producing a general olefin-aromatic vinyl compound-aromatic polyene copolymer that may be used in the present invention are described in, for example, Japanese Patent Laid-Open No. 2009-161743, Japanese Patent Laid-Open No. 2010-280771 and International Publication No. WO 00/37517. The olefin-aromatic vinyl compound-aromatic polyene copolymer (hereinafter, may be simply referred to as "copolymer" in the specification) satisfies all of the following conditions (1) to (4).

(1) The number average molecular weight of the copolymer is 5000 or more and 100000 or less, preferably 20000 or more and 100000 or less, and more preferably 30000 or more and 100000 or less.

(2) The aromatic vinyl compound monomer is an aromatic vinyl compound having 8 or more and 20 or less carbon atoms, and the content of the aromatic vinyl compound monomer unit is 0 mass % or more and 70 mass % or less.

(3) The aromatic polyene is one or more selected from polyenes having 5 or more and 20 or less carbon atoms and having a plurality of vinyl groups and/or vinylene groups in the molecule, and the content of the vinyl groups and/or the vinylene groups derived from the aromatic polyene unit is 1.5 pieces or more and less than 20 pieces, preferably 1.5 pieces or more and less than 7 pieces, more preferably 2 pieces or more and less than 5 pieces, per number average molecular weight.

(4) The olefin is one or more selected from olefins having 2 or more and 20 or less carbon atoms, and the total of the olefin monomer unit, the aromatic vinyl compound monomer unit, and the aromatic polyene monomer unit is 100 mass %.

The olefin-aromatic vinyl compound-aromatic polyene copolymer may be obtained by copolymerizing each of the monomers of an olefin, an aromatic vinyl compound, and an aromatic polyene.

The olefin monomer is one or more selected from α-olefins having 2 or more and 20 or less carbon atoms and cyclic olefins having 5 or more and 20 or less carbon atoms, which is a compound composed of carbon and hydrogen, substantially containing no oxygen, nitrogen, or halogen. Examples of the α-olefins having 2 or more and 20 or less carbon atoms include ethylene, propylene, 1-butene, 1-hexene, 1-octene, 1-decane, 1-dodecane, 4-methyl-1-pentene, and 3,5,5-trimethyl-1-hexene. Examples of the cyclic olefin having 5 or more and 20 or less carbon atoms include norbornene and cyclopentene. The olefin is preferably a combination of ethylene and an α-olefin or a cyclic olefin other than ethylene, or ethylene alone. In the case where the olefin is ethylene alone, or the mass ratio α-olefin other than ethylene contained/ethylene is 1/7 or less, more preferably 1/10 or less, the peel strength of the resulting cured product from a copper foil or copper wiring may be favorably increased. Still more preferably, the content of the α-olefin monomer unit other than ethylene contained in the copolymer is 6 mass % or less, most preferably 4 mass % or less, or the olefin is ethylene alone. In this case, the peel strength from a copper foil or copper wiring may be further favorably increased. Further, in a preferred combination of ethylene and an α-olefin other than ethylene, the glass transition temperature of the ethylene-α-olefin-aromatic vinyl compound-aromatic polyene chain of the finally resulting cured product can be freely adjusted in the range of about −60° C. to −5° C., preferably −50° C. to −10° C., depending on the type and content of the α-olefin.

The aromatic vinyl compound monomer is an aromatic vinyl compound having 8 or more and 20 or less carbon atoms, and examples thereof include styrene, paramethylstyrene, paraisobutylstyrene, various vinylnaphthalenes, and various vinylanthracenes.

The aromatic polyene monomer is a polyene having 5 or more and 20 or less carbon atoms, preferably 8 or more and 20 or less carbon atoms, and having a plurality of vinyl groups and/or vinylene groups in the molecule. The aromatic polyene monomer is preferably a polyene having 8 or more and 20 or less carbon atoms and having a plurality of vinyl groups in the molecule, being more preferably various (ortho, meta, and para) divinylbenzenes or a mixture thereof, and a compound composed of carbon and hydrogen, substantially containing no oxygen, nitrogen, or halogen, having an aromatic vinyl structure such as divinylnaphthalene, divinylanthracene, p-2-propenylstyrene, and p-3-butenylstyrene. Alternatively, a bifunctional aromatic vinyl compound described in Japanese Patent Laid-Open No. 2004-087639, for example, 1,2-bis(vinylphenyl)ethane (abbreviation: BVPE) may be used. Among these, various (ortho, meta and para) divinylbenzenes, or mixtures thereof are preferably used, and a mixture of meta and paradivinylbenzene is most preferably used. In the specification, these are referred to as divinylbenzenes. Use of divinylbenzenes as the aromatic polyene is preferred, because the curing efficiency is high in a curing process to achieve easy curing.

Each of the monomers of the olefin, aromatic vinyl compound, and aromatic polyene may further include an olefin containing a polar group such as an oxygen atom, a nitrogen atom, etc., an aromatic vinyl compound containing an oxygen atom, a nitrogen atom, etc., or an aromatic polyene containing an oxygen atom, a nitrogen atom, etc. However, the total mass of the monomers containing these polar groups is preferably 10 mass % or less, more preferably 3 mass % or less, relative to the total mass of the composition, and it is most preferable that no monomers containing a polar group be contained. By setting the content to 10 mass % or less, the low dielectric property (low dielectric constant/low dielectric loss) of the cured product obtained by curing the composition may be improved.

The number average molecular weight of the copolymer is 5000 or more and 100000 or less, preferably 20000 or more and 100000 or less, and more preferably 30000 or more and 100000 or less. Within such a range, addition of an additive resin into an uncured state improves the thermoplasticity without stickiness, and easily imparts good physical properties such as high strength at break and high elongation at break to a finally resulting cured product. With a number average molecular weight of less than 5000, the composition at the uncured stage has low mechanical properties and high stickiness, so that the composition may be difficult to be molded as a thermoplastic resin. With a number average molecular weight of higher than 100000, the moldability may decrease. The content of the aromatic vinyl compound monomer unit contained in the copolymer is 0 mass % or more and 70 mass % or less, preferably 10 mass % or more and 60 mass % or less, and more preferably 10 mass % or more and 55 mass % or less. With a content of the aromatic vinyl compound monomer unit of more than 70 mass %, the glass transition temperature of the cured product of a finally resulting composition is in the vicinity of room temperature, and the toughness and elongation at low temperatures may decrease. With a content of the aromatic vinyl compound monomer unit of 10 mass % or more, the aromaticity of the copolymer is improved, the compatibility with a flame retardant and a filler is improved, and filling with the filler may be performed without bleeding out of the flame retardant. Further, with a content of the aromatic vinyl compound monomer unit of 10 mass % or more, a cured product of the composition having high peel strength from a copper foil or copper wiring may be obtained.

In the copolymer, the content of the vinyl group and/or vinylene group derived from an aromatic polyene unit is 1.5 pieces or more and less than 20 pieces, preferably 2 pieces or more and less than 20 pieces, and more preferably 3 pieces or more and less than 10 pieces, per number average molecular weight. The content of vinyl group and/or vinylene group may be collectively referred to as "vinyl group content" in the following. With less than 1.5 pieces, the cross-linking efficiency is low, and it becomes difficult to obtain a cured product having a sufficient cross-linking density. With increase in the vinyl group content, it becomes easy to improve the mechanical properties of the finally resulting cured product at normal temperature and high temperature. The content of the vinyl group derived from the aromatic polyene unit per number average molecular weight in the copolymer may be obtained by comparing the number average molecular weight (Mn) in terms of standard polystyrene obtained by GPC (gel permeation chromatography) method known to those skilled in the art with the vinyl group content and the vinylene group content derived from the aromatic polymer unit obtained by $^1$H-NMR measurement. As an example, in the case where the vinyl group content derived from the aromatic polyene unit in the copolymer is 0.095 mass % resulting from comparison of the intensity of each peak area obtained by $^1$H-NMR measurement, and the number average molecular weight in terms of standard polystyrene by GPC measurement is 68000, the molecular weight of the vinyl group derived from the aromatic polyene unit in the number average molecular weight is 64.8, which is the product of these. The product is divided by 27, which is the formula weight of the vinyl group, to obtain 2.4. That is, the content of vinyl group derived from the aromatic polyene unit per number average molecular weight in the copolymer is 2.4 pieces. The attribution of peaks obtained by $^1$H-NMR measurement of the copolymer is known in literature. Further, a method for obtaining the composition of the copolymer from the comparison of the peak areas obtained by $^1$H-NMR measurement is also known. Further, in the specification, the content of the divinylbenzene unit in the copolymer is determined from the peak intensity of the vinyl group derived from the divinylbenzene unit (according to $^1$H-NMR measurement). That is, from the content of the vinyl group derived from the divinylbenzene unit, the content of the divinylbenzene unit is determined by assuming that one piece of vinyl group is derived from one piece of divinylbenzene unit in the copolymer.

In the copolymer, the content of the olefin monomer unit is preferably 30 mass % or more, and particularly preferably 45 mass % or more. The total of the olefin monomer unit, the aromatic vinyl compound monomer unit, and the aromatic polyene monomer unit is 100 mass %. With an olefin monomer unit content of 30 mass % or more, the toughness (elongation) of the finally resulting cured product is improved, resulting in no cracks during curing, no decrease in impact resistance of the cured product, and no occurrence of cracks of the cured product during a heat cycle test. In the copolymer, the preferred olefin monomer unit content is 90 mass % or less.

In the copolymer, preferred specific examples of the olefin-aromatic polyene copolymer containing no aromatic vinyl compound monomer unit include an ethylene-divinylbenzene copolymer, an ethylene-propylene-divinylbenzene copolymer, an ethylene-1-butene-divinylbenzene copolymer, an ethylene-1-hexene-divinylbenzene copolymer, and an ethylene-1-octene-divinylbenzene copolymer.

In the copolymer, examples of the olefin-aromatic vinyl compound-aromatic polyene copolymer containing an aromatic vinyl compound monomer unit include an ethylene-styrene-divinylbenzene copolymer, an ethylene-propylene-styrene-divinylbenzene copolymer, an ethylene-1-hexene-styrene-divinylbenzene copolymer, and an ethylene-1-octene-styrene-divinylbenzene copolymer.

Additive Resins

The composition of the present invention may contain a one or a plurality of resins selected from a hydrocarbon-based elastomer, a polyphenylene ether, an olefin-aromatic vinyl compound-aromatic polyene copolymerized oligomer, and an aromatic polyene-based resin (simply referred to as "additive resins" in the specification) in a total amount of preferably 1 to 500 parts by mass, more preferably 1 to 300 parts by mass, relative to 100 parts by mass of the copolymer contained. As the additive resin, a polyphenylene ether and/or a hydrocarbon-based elastomer may be particularly preferably used. Among the hydrocarbon-based elastomers, conjugated diene-based polymers are preferred. Among the conjugated diene-based polymers, 1,2-polybutadiene is preferred. Use of polyphenylene ether and/or 1,2-polybutadiene allows the amount of monomers used to be reduced, and for example, a suitable cured product of the present invention may be obtained without using monomers.

Hydrocarbon-Based Elastomers

The amount of the hydrocarbon-based elastomer used in the composition of the present invention is preferably 1 to 500 parts by mass, more preferably 1 to 200 parts by mass relative to 100 parts by mass of the copolymer. Hydrocarbon-based elastomers that can be suitably used in the composition of the present invention are one or more elastomers that are selected from ethylene-based and propylene-based elastomers, conjugated diene-based polymers, aromatic vinyl compounds-conjugated diene-based block copolymers or random copolymers, and hydrides (hydrogenated product). The number average molecular weight of the hydrocarbon-based elastomer is 1000 or more, more preferably 2000 or more, still more preferably 20000 or more, and most preferably 30000 or more. The number average molecular weight of the hydrocarbon-based elastomer is preferably 80000 or less, more preferably 60000 or less.

Examples of the ethylene-based elastomer include an ethylene-octene copolymer, an ethylene-α-olefin copolymer such as ethylene-1-hexene copolymer, EPR and EPDM, and examples of the propylene-based elastomer include an atactic polypropylene, a polypropylene having low stereoregularity, and a propylene-α-olefin copolymer such as propylene-1-butene copolymer.

Examples of the conjugated diene polymer include polybutadiene and 1,2-polybutadiene. Examples of the aromatic vinyl compound-conjugated diene-based block copolymer or random copolymer, and a hydride (hydrogenated product) thereof include SBS, SIS, SEBS, SEPS, SEEPS, and SEEBS. The 1,2-polybutadiene that may be preferably used may be obtained, for example, as a product of JSR Corporation, or may be obtained as a liquid polybutadiene from Nippon Soda Co., Ltd., under product name of B-1000, B-2000 or B-3000. Further, examples of the copolymer containing a 1,2-polybutadiene structure that may be preferably used include "Ricon 100" manufactured by TOTAL Cray Valley. In the case where one or a plurality of resins selected from these hydrocarbon-based elastomers are in a liquid state (approximately 300000 mPaS or less) at room temperature (25° C.), the amount thereof used is preferably in the range of 1 to 30 parts by mass, particularly preferably 1 to 20 parts by mass relative to 100 parts by mass of the copolymer, from the viewpoint of handleability and moldability of the composition of the present invention in an uncured state (handleability as a thermoplastic resin).

Polyphenylene Ether

As the polyphenylene ether, commercially available known polyphenylene ether may be used. The number average molecular weight of the polyphenylene ether is optional, preferably 10000 or less, and most preferably 5000 or less, in consideration of the moldability of the composition. The number average molecular weight is preferably 500 or more, most preferably 1000 or more. Further, in the case of addition for the purpose of curing the composition of the present invention, it is preferable that the molecular end be modified, and/or a plurality of functional groups be contained in one molecule. Examples of the functional group include functional groups such as an allyl group, a vinyl group and an epoxy group, most preferably a radically polymerizable functional group, and a vinyl group, particularly a (meth)acryloyl group or an aromatic vinyl group. That is, in the composition of the present invention, a bifunctional polyphenylene ether having a molecular chain modified with radically polymerizable functional groups at both ends is particularly preferred. Examples of such a polyphenylene ether include Noryl (trademark) SA9000 manufactured by SABIC, and a bifunctional polyphenylene ether oligomer (OPE-2St) manufactured by Mitsubishi Gas Chemical Company, Inc. may be particularly preferably used. The amount of the polyphenylene ether used in the composition of the present invention is preferably 1 to 200 parts by mass, more preferably 10 to 100 parts by mass, relative to 100 parts by mass of the copolymer.

Olefin-Aromatic Vinyl Compound-Aromatic Polyene Copolymerized Oligomers

Further, an olefin-aromatic vinyl compound-aromatic polyene copolymerized oligomer may also be added for curing of the present invention, and particularly preferably, an olefin-aromatic vinyl compound-aromatic polyene copolymerized oligomer satisfying the following conditions (1A) to (4A) may also be added. The olefin-aromatic vinyl compound-aromatic polyene copolymerized oligomer referred to here excludes the above-mentioned olefin-aromatic vinyl compound-aromatic polyene copolymer satisfying the above conditions (1) to (4).

(1A) The number average molecular weight of the copolymerized oligomer is 500 or more and less than 5000.

(2A) The aromatic vinyl compound monomer is an aromatic vinyl compound having 8 or more and 20 or less carbon atoms, and the content of the aromatic vinyl compound monomer unit is 0 mass % or more and 70 mass % or less.

(3A) The aromatic polyene is one or more selected from polyenes having 5 or more and 20 or less carbon atoms and having a plurality of vinyl groups and/or vinylene groups in the molecule, and a vinyl group content derived from the aromatic polyene unit is 1.5 pieces or more per number average molecular weight.

(4A) The olefin is one or more selected from olefins having 2 or more and 20 or less carbon atoms. The olefin monomer unit content is 30 mass % or more, and the total of the olefin monomer unit, the aromatic vinyl compound monomer unit and the aromatic polyene monomer unit is 100 mass %.

The amount of the olefin-aromatic vinyl compound-aromatic polyene copolymerized oligomer used in the composition of the present invention is preferably in the range of 1 to 49 parts by mass relative to 100 parts by mass of the copolymer. Further, the amount is preferably 1 to 30 parts by mass, particularly preferably 1 to 20 parts by mass, relative to 100 parts by mass of the copolymer, from the viewpoint of handleability and moldability of the composition of the present invention in an uncured state.

The definitions or determination of the olefin, the aromatic vinyl compound, the aromatic polyene, the number average molecular weight, and the vinyl group content are the same as in the case of the above-mentioned copolymer. The method for determining the number average molecular weight of the copolymerized oligomer is as follows. Regarding the molecular weight, the number average molecular weight (Mn) in terms of standard polystyrene is determined using GPC (gel permeation chromatography). The measurement may be performed under the following conditions.

In the Case of a Number Average Molecular Weight of 1000 or More

Column: Two TSK-GEL Multipore HXL-M having a diameter of 7.8 mm and a length of 300 mm (manufactured by Tosoh Corporation) are connected in series for use.
Column temperature: 40° C.
Solvent: THF
Liquid flow rate: 1.0 ml/min
Detector: RI detector (differential refractive index detector)

In the Case of a Number Average Molecular Weight of Less than 1000

Column: One TSKgelG3000HXL having a diameter of 7.8 mm and a length of 300 mm, one TSKgelG2000HXL having a diameter of 7.8 mm and a length of 300 mm, and four TSKgelG1000HXL having a diameter of 7.8 mm and a length of 300 mm (manufactured by Tosoh Corporation) are connected in series for use.
Column temperature: 40° C.
Solvent: THF
Liquid flow rate: 0.5 ml/min
Detector: RI detector Aromatic Polyene-Based Resins The aromatic polyene-based resin includes a divinylbenzene-based reactive multi-branched copolymer (PDV) manufactured by NIPPON STEEL Chemical & Material Co., Ltd. Such PDV is described, for example, in literature "Synthesis of polyfunctional aromatic vinyl copolymers and development of novel IPN-type low dielectric loss material using the same," M. Kawabe et al., Journal of The Japan Institute of Electronics Packaging, p. 125, Vol. 12, No. 2 (2009). Further, examples of the aromatic polyene-based resin also include an aromatic polyene polymer resin containing the above-mentioned aromatic polyene monomer as a main constituent unit.

Curing Agents

As the curing agent for use in the curable composition of the present invention, a known curing agent that may be conventionally used for polymerization or curing of aromatic polyenes and aromatic vinyl compounds may be used. Examples of such a curing agent include a radical polymerization initiator, a cationic polymerization initiator, and an anionic polymerization initiator, and a radical polymerization initiator may be preferably used. Preferably, the curing agent is an organic peroxide-based (peroxide) or azo-based polymerization initiator, which may be freely selected depending on the application and conditions. Catalogs showing examples of organic peroxides may be downloaded from the following NOF CORPORATION websites.

https://www.nof.co.jp/business/chemical/product01a.html
https://www.nof.co.jp/business/chemical/product01b.html
https://www.nof.co.jp/business/chemical/product01c.html Examples of the organic peroxide are also described in the catalogs of FUJIFILM Wako Pure Chemical Corporation and Tokyo Chemical Industry Co., Ltd. The curing agent used in the present invention may be obtained from these companies. Further, a known photopolymerization initiator using light, ultraviolet rays, or radiation may also be used as the curing agent. Examples of the curing agent using the photopolymerization initiator include a photo radical polymerization initiator, a photo cationic polymerization initiator, and a photo anionic polymerization initiator. Such a photopolymerization initiator may be obtained from, for example, Tokyo Chemical Industry Co., Ltd. Furthermore, curing may be performed by radiation or electron beam itself. Alternatively, cross-linking and curing may be performed by thermal polymerization of the raw materials contained without a curing agent.

The amount of the curing agent used is not particularly limited, and in general preferably 0.01 to 10 parts by mass relative to 100 parts by mass of the composition. In the case where a curing agent such as organic peroxide-based (peroxide) or azo-based polymerization initiator is used, the curing treatment is performed at an appropriate temperature and time in consideration of the half-life thereof. The conditions in this case are optional according to the curing agent, and in general, a temperature range of about 50° C. to 180° C. is suitable.

Monomers

The amount of monomers that the composition of the present invention may contain is optional, preferably 10 parts by mass or less relative to 100 parts by mass of the copolymer. Incidentally, the composition may contain substantially no monomers. With an amount of monomers of 10 parts by mass or less, the uncured composition has no viscous property, and easy moldability as a thermoplastic resin is achieved. Further, with a content of easily volatile monomers below a certain level, the odor at the uncured stage causes no problem. In the case where a solvent is added to a composition to take a product form in varnish form, there is a problem that monomers are lost as the solvent (medium) evaporates during use, so that substantial monomer content tends to decrease. Further, in the case where the product form is an uncured sheet, with a certain amount or less of monomers contained, change in the monomer content during storage hardly occurs. The monomer that may be suitably used in the composition of the present invention has a molecular weight of preferably less than 1000, more preferably less than 500. Monomers that may be suitably used in the composition of the present invention are aromatic vinyl compound monomers, aromatic polyene monomers, and/or polar monomers. As the monomers, monomers that may be polymerized with a radical polymerization initiator are preferred, and aromatic vinyl compounds and aromatic polyenes are more preferred. Further, BVPE (1,2-bis(vinylphenyl)ethane) described in Japanese Patent Laid-Open No. 2003-212941 may also be preferably used. From the viewpoint of enhancing the mechanical strength (elastic modulus) of a cured product at high temperature, the amount of aromatic polyene is preferably 1 part by mass or more and 30 parts by mass or less relative to 100 parts by mass of the copolymer. Further, a relatively small amount of polar monomer may be used for the purpose of imparting adhesiveness to other materials required as an insulating material or improving the cross-linking density. Examples of the above-mentioned polar monomer include various maleimides, bismaleimides, maleic anhydride, glycidyl (meth)acrylate, triallyl isocyanurate, tri(meth)acrylic isocyanurate, and trimethylolpropane tri(meth)acrylate. Maleimides and bismaleimides that may be used in the present invention are described in, for example, International Publication No. WO 2016/114287 and Japanese Patent Application Laid-Open No. 2008-291227, and may be purchased from, for example, Daiwa Kasei Industry Co., Ltd. or Designer Molecules Inc. As these maleimide group-containing compounds, bismaleimides are preferred from the viewpoints of solubility in an organic solvent, high frequency properties, high adhesiveness to a conductor, moldability of a prepreg, etc.

As bismaleimides, the bismaleimides represented by the following formula (B-1) are preferred.

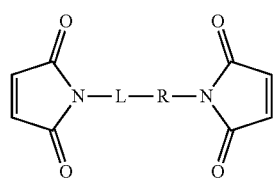

Formula (B-1)

In Formula (B-1), R represents an alkylene group having 5 or more carbon atoms, and L represents a single bond or a divalent linking group. R and L each independently may have a substituent. The maleimides represented by Formula (B-1) are preferably represented by the following Formula (B-2).

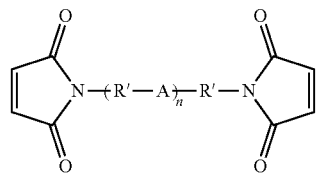

Formula (B-2)

In Formula (B-2), R' each independently represent an alkylene group having 5 or more carbon atoms which may have a substituent, and A each independently represent an alkylene group having 5 or more carbon atoms which may have a substituent, or a divalent group having an aromatic ring which may have a substituent. Further, n represents an integer from 1 to 10.

Examples of maleimides represented by Formula (B-2) include compounds represented by the following Formula (B-3). In the formula, n represents an integer from 1 to 10. Examples of the compound represented by Formula (B-3) include BMI-1500 (n=1.3 on average) manufactured by Designer Molecules Inc.

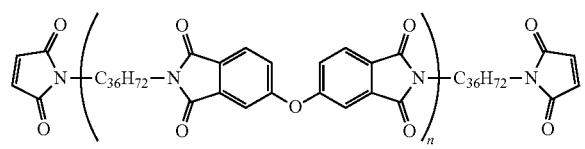

Formula (B-3)

Bismaleimides may be used as a polyaminobismaleimide compound. The polyaminobismaleimide compound is obtained, for example, from a Michael addition reaction of a compound having two maleimide groups at a terminal and an aromatic diamine compound having two primary amino groups in a molecule. For obtaining high cross-linking efficiency with a small amount of addition, it is preferable to use a polar monomer having a polyfunctional group containing two or more functional groups, and examples thereof include bismaleimides, triallyl isocyanurate (TRIC), and trimethylolpropane tri(meth)acrylate. The amount of the polar monomer that may be contained in the composition is in the range of 0.1 to 10 parts by mass, preferably 0.1 to 5 parts by mass, relative to 100 parts by mass of the copolymer. By using 10 parts by mass or less, the dielectric constant and dielectric tangent of the resulting cured product is reduced. For example, the dielectric constant is less than 3.0 and the dielectric tangent is lower than 0.005.

Solvent (Medium)

An appropriate solvent may be added to the composition of the present invention on an as needed basis. The solvent is used to adjust the viscosity and fluidity of the composition. The solvent is preferably volatile, and, for example, cyclohexane, toluene, ethylbenzene, acetone or isopropanol is used. The amount used is preferably 10 parts by mass or less relative to 100 parts by mass of the copolymer of the present invention from the viewpoint of moldability and handling of the composition before curing as a thermoplastic resin, and it is more preferable that substantially no solvent be used from the viewpoint of removal during curing and after curing. Substantially no solvent used means preferably 5 parts by mass or less, more preferably 1 part by mass or less, and most preferably 0 parts by mass. In the case of using as a varnish, it is preferable to add an appropriate solvent to the composition of the present invention. The solvent is used to adjust the viscosity and fluidity of the composition as a varnish. As the solvent, a solvent having a boiling point of a certain level or more is preferred, because an applied film having a uniform thickness is obtained with a solvent having a high boiling point under atmospheric pressure, that is, having a low volatility. The preferred boiling point is approximately 100° C. or more, preferably 130° C. or more and 300° C. or less, under atmospheric pressure. Examples of the solvent suitably used for a varnish include toluene, xylene, mesitylene, ethylbenzene, limonene, ethylene glycol methyl ether acetate, ethylene glycol monoethyl ether acetate, and ethylene glycol monobutyl ether. The amount used is preferably in the range of 10 to 2000 parts by mass relative to 100 parts by mass of the composition of the present invention.

Compositions

The composition of the present invention may further contain one or more selected from fillers, flame retardants and surface modifiers in the composition. The composition of the present invention comprises one or more selected from these fillers, flame retardants and surface modifiers in order to be a matrix of cured products and to have excellent filling properties of other materials when cured. Even after curing, the cured product may easily exhibit impact resistance and toughness.

Fillers

Further, a known inorganic or organic filler may be added on an as needed basis. These fillers are added for the purpose of controlling the coefficient of thermal expansion, controlling the thermal conductivity, and reducing the cost, and the amount used thereof is optional depending on the purpose. The composition of the present invention may contain a large amount of inorganic filler, in particular, and the amount used thereof may reach 2000 parts by mass relative to 100 parts by mass of the copolymer. In particular, in the case of adding an inorganic filler, it is preferable to use a known surface modifier, for example, a silane coupling agent. In particular, for the purpose of producing a composition excellent in low dielectric constant and low dielectric loss, which is one of the objects of the present invention, boron nitride (BN) and/or silica are preferred as the inorganic filler, and silica is preferred. Among silicas, fused silica is preferred. From the viewpoint of low dielectric properties, since the dielectric constant may increase high with a large amount of addition or compounding, in particular, the filler in amount of preferably less than 500 parts by mass, more preferably less than 400 parts by mass, relative to 100 parts by mass of the copolymer is used. In order to improve the low dielectric properties (low dielectric constant and low dielectric loss tangent), a hollow filler or a filler having a shape with many voids may be added.

Alternatively, an organic filler such as high molecular weight or ultra-high molecular weight polyethylene may be used instead of inorganic fillers. It is preferable that the organic filler be crosslinked by itself from the viewpoint of heat resistance, and it is preferable that the organic filler be used in a form of fine particles or powder. These organic fillers may suppress the increase in dielectric constant and dielectric tangent. The amount of the filler used is most preferably 1 part by mass or more and less than 400 parts by mass relative to 100 parts by mass of the copolymer.

Meanwhile, in the composition of the present invention, a high dielectric constant insulating filler having a dielectric constant at 1 GHz of preferably 3 to 10000, more preferably 5 to 10000, may be mixed and dispersed to prepare an insulating cured product having a high dielectric constant insulating layer having a dielectric constant of preferably 3.1 to 20, with suppressed increase in dielectric tangent (dielectric loss). With increase in the dielectric constant of the film made of insulating cured product, downsizing of a circuit and increase in capacity of a capacitor may be achieved, which contribute to downsizing of electric components for high frequencies. The high dielectric constant and low dielectric tangent insulating layer is suitable for applications such as capacitors, inductors for resonant circuits, filters, and antennas. Examples of the high dielectric constant insulating filler used in the present invention include inorganic fillers and insulated metal particles. Specific examples include known high dielectric constant inorganic fillers such as barium titanate and strontium titanate, and other examples are specifically described in, for example, Japanese Patent Application Laid-Open No. 2004-087639.

Flame Retardants

A known flame retardant may be used in the composition of the present invention. Preferred flame retardants are known organic phosphorus-based flame retardants such as phosphoric acid esters or condensates thereof, known bromine-based flame retardants, and red phosphorus, from the viewpoint of maintaining low dielectric constant and low dielectric tangent. In particular, among phosphoric acid esters, a compound having a plurality of xylenyl groups in the molecule is preferred from the viewpoint of flame retardancy and low dielectric tangent property.

In addition to the flame retardants, flame retardant aids including antimony compounds such as antimony trioxide, antimony tetroxide, antimony pentoxide and sodium antimonate, or nitrogen-containing compounds such as melamine, triallyl-1,3,5-triazine-2,3,4-(1H, 3H, 5H)-trione, and 2,4,6-triallyloxy-1,3,5-triazine may be added. In general, the total amount of these flame retardants and flame retardant aids is preferably 1 to 100 parts by mass relative to 100 parts by mass of the composition. Alternatively, 30 to 200 parts by mass of the polyphenylene ether (PPE)-based resin having a low dielectric constant and excellent flame retardancy may be compounded relative to 100 parts by mass of the flame retardant.

Surface Modifiers

The composition of the present invention may contain various surface modifiers for the purpose of improving adhesion to fillers, copper plates, and wiring. The amount of the surface modifier used is preferably 0.01 to 10 parts by mass, more preferably 0.1 to 5 parts by mass, relative to 100 parts by mass of the composition of the present invention other than the surface modifier. Examples of the surface modifier include various silane coupling agents and titanate-based coupling agents. One or a plurality of various silane coupling agents and titanate-based coupling agents may be used.

In the present invention, by changing the compounding ratio of the copolymer, monomer, additive resin, and solvent on an as needed basis of the composition within the above range, or further, by changing the compounding ratio of the flame retardant, filler, and surface modifier, the fluidization temperature of the curable resin or the composition may be adjusted according to the purpose and molding method. Specifically, the composition of the present invention may take various product forms such as "thermoplastic composition", "semi-cured state (i.e., B stage sheet or the like)", and "varnish".

As described above, the composition of the present invention may be obtained by mixing/dissolving or melting one or more selected from a copolymer, a curing agent, and on an as needed basis, a monomer, a solvent, an additive resin, a filler, a flame retardant, and a surface modifier. Any known method may be adopted as the method of mixing, dissolving or melting.

Thermoplastic Compositions and Molded Products

The composition of the present invention uses a copolymer having a molecular weight in the range above a certain level and contains the predetermined additive resin so as to exhibit the properties of a thermoplastic resin. Therefore, under conditions not causing cross-linking, the composition may be molded into a shape such as sheet, tube, strip and pellet, in a substantially uncured state by a known molding method for a thermoplastic resin, and then may be cross-linked (cured). In the specification, the term "sheet" also includes the concept of a film. Further, the term "film" described in the specification also includes the concept of a sheet.

The preferred embodiment of the present composition is as follows. In the case where the composition contains more than a certain percentage of one or a plurality of resins selected from the hydrocarbon-based elastomer, polyphenylene ether, olefin-aromatic vinyl compound-aromatic polyene copolymerized oligomer, and aromatic polyene-based resin, excluding resins in a liquid state at room temperature, the molding in an uncured state as thermoplastic resin is easy as well. Specifically, the hydrocarbon-based elastomer (excluding resins in liquid state) and/or polyphenylene ether in the range of 30 to 200 parts by mass relative to 100 parts by mass of the copolymer may be added. In the case where the additive resin is in a liquid state at room temperature, the amount added may be in the range of preferably 1 to 30 parts by mass, particularly preferably 1 to 20 parts by mass relative to 100 parts by mass of the copolymer. The amount of the monomer that may be used in the present thermoplastic composition is preferably 10 parts by mass or less relative to 100 parts by mass of the copolymer. The number average molecular weight of the copolymer used is 5000 or more and 100000 or less, preferably 20000 or more and 100000 or less, and more preferably 30000 or more and 100000 or less. The thermoplastic composition is molded into various shapes such as a sheet in advance by taking advantage of the thermoplasticity at a temperature equal to or lower than the working temperature of the curing agent, and may be cured by heating after combining with a semiconductor device, wiring, or a substrate and a laminate, on an as needed basis, so as to achieve adhesion.

The composition of the present invention may be provided as a sheet by molding a composition melted by heating at a temperature equal to or less than the working temperature or the decomposition temperature of the curing agent by a known method. Alternatively, the sheet may be molded by extrusion molding with a T-die, double rolling, or extrusion lamination to a base film. In this case, the formulation of the composition and the mass ratio copolymer/monomer, or the solvent, the additive resin, and the flame retardant are selected and adjusted, such that melting is performed at a temperature equal to or less than the working temperature or the decomposition temperature of the curing agent and solidification occurs in the vicinity of room temperature. The sheet in this case is in a substantially uncured state. Then, through various processing and assembling steps, finally, complete curing is performed for a processing time at a temperature equal to or more than the working temperature or the decomposition temperature of the curing agent. Such a method is a general technique used for an ethylene-vinyl acetate resin-based cross-linked sealant sheet of a solar cell (solar power generation device).

Molded Products in Semi-Cured State (e.g., B Stage Sheets)

Further, the composition of the present invention may be also made into a molded product such as a sheet and a tube in a partially cross-linked state, for example, with a part of the curing agent contained therein being reacted to a semi-cured state (so-called "B stage state"). For example, semi-curing is achieved by adopting a plurality of curing agents having different curing temperatures and/or curing conditions, so that the melt viscosity and fluidity may be controlled to make the B stage state. That is, by a first stage curing (partial curing), the present curable resin or composition is formed into an easy-to-handle B stage sheet, which is laminated on an electronic device or a substrate to be pressure-bonded. Then, a second stage curing (complete curing) may be performed to obtain a final shape. In this case, the formulation of the composition, that is, the mass ratio copolymer/monomer, is selected, and on an as needed basis, a solvent, an additive resin, and a flame retardant are added. Then, the composition further containing a curing agent such as a peroxide is partially cured and adjusted to a sheet shape (in the B stage state). After a device is molded and assembled, complete curing is performed by heating under pressure. As a method for partially curing the composition, a known method may be adopted. For example, according to the method, peroxides having different decomposition temperatures are used in combination. A semi-cured sheet is obtained through a treatment at a temperature at which only one of them substantially acts for a predetermined time. Finally, through a treatment at a temperature at which all the curing agents act for a sufficient time, complete curing is performed.

Further, the molded product may be a sheet. The sheet may be uncured (semi-cured) to an extent that the sheet shape can be maintained, or may be completely cured. The degree of curing of the composition may be quantitatively measured by a known dynamic mechanical analysis (DMA).

Compositions in Varnish Form and Molded Products Thereof

The composition of the present invention may be also in a varnish form in viscous liquid state depending on the composition and compounding ratio. For example, by using a sufficient amount of solvent and/or by using an appropriate amount of a liquid monomer, a varnish form may be obtained. In particular, for use as a varnish, it is preferable to add an appropriate solvent to the composition of the present invention. The solvent is used to adjust the viscosity and fluidity of the composition as a varnish. A solvent having a boiling point at a certain level or more is preferred, because the solvent having a high boiling point under atmospheric pressure, that is, low volatility, allows a uniform thickness of the applied film to be produced. The preferred boiling point is approximately 100° C. or more, preferably 130° C. or more and 300° C. or less, under atmospheric pressure. Examples of the solvent suitably used for a varnish include xylene, mesitylene, ethylbenzene, limonene, ethylene glycol methyl ether acetate, ethylene glycol monoethyl ether acetate, and ethylene glycol monobutyl ether. The amount used is preferably in the range of 10 to 2000 parts by mass relative to 100 parts by mass of the composition of the present invention. The composition in a varnish form of the present invention may also be prepared by utilizing a polymerization solution containing the copolymer of the present invention obtained by polymerization. For example, a polymerization solution may be concentrated or treated to remove residual monomers. On an as needed basis, a solvent, other resin components, various additives, etc. may be added to adjust the component concentration and solution viscosity in the production process.

The varnish may be, for example, applied to a base material, or a base material may be impregnated with the varnish, and the solvent or the like may be removed by drying or the like, so that the varnish may be made into an uncured or semi-cured molded product. Generally, the molded product is in a sheet, film, or tape form.

Curing Process

The composition may be cured by a known method by reference to curing conditions (temperature, time and pressure) of the curing agent contained. In the case where the curing agent used is a peroxide, the curing conditions may be determined by reference to the half-life temperature and the like disclosed for each peroxide.

Cured Products Obtained from Compositions

The dielectric constant of the cured product obtained from the composition of the present invention is 3.0 or less and 2.0 or more, preferably 2.8 or less and 2.0 or more, and particularly preferably 2.5 or less and 2.0 or more, at 10 GHz. The dielectric tangent is 0.005 or less and 0.0003 or more, preferably 0.003 or less and 0.0005 or more. The dielectric constant and dielectric tangent may be obtained by any method known to those skilled in the art, for example, by a resonator method (cavity resonator perturbation method or balanced disk resonator method). The volume resistivity of the resulting cured product is preferably $1 \times 10^{15}$ Ω·cm or more. These values are preferred values, for example, as an electrically insulating material for high frequencies of 3 GHz or more. Since the copolymer used in the composition of the present invention is relatively soft and has high tensile elongation, the cured product obtained from the composition using the copolymer is relatively soft and has high impact resistance and followability to the thermal expansion of a base material while exhibiting sufficient mechanical properties. That is, the cured product of the present invention has a tensile elastic modulus of less than 3 GPa and 3 MPa or more, preferably 5 MPa or more, as measured at room temperature (23° C.). Further, in the case where a relatively large amount of filler is compounded, the tensile elastic modulus may take a value of 3 GPa or more and 20 GPa or less. The tensile strength at break is preferably less than 50 MPa and 3 MPa or more, more preferably 5 MPa or more, and the tensile elongation at break is preferably 30% or more and less than 300%, more preferably 50% or more and less than 250%. In particular, in the case where a relatively large amount of filler is blended, the tensile elongation at break may take a value of less than 30%. The cured product of the composition of the present invention may have sufficient heat resistance for practical use. Specifically, in terms of practical aspects, the cured product of the composition of the present invention may have a storage elastic modulus at 300° C. of $5 \times 10^5$ Pa or more, preferably $1 \times 10^6$ Pa or more. Those skilled in the art may easily prepare a cured product by determining the compounding of the composition having the physical property parameters by reference to the information described in the specification and publicly known materials. The cured product obtained from the composition of the present invention has sufficient heat resistance and mechanical properties at high temperature for practical use even under condition with the monomer and the aromatic polyene as monomer component in the composition suppressed to a certain ratio or less. It is important to suppress the monomer and the aromatic polyene as monomer component to a certain ratio or less also for maintaining the moldability as a thermoplastic resin even in the uncured state as described above.

General Use of Compositions

The composition of the present invention may be used as various insulating materials for wiring, preferably wiring of high frequency signals, such as coverlays, solder resists, build-up materials, interlayer insulators, bonding sheets, interlayer adhesives, and bumps for flip chip bonders. Further, the composition may be used as an electrically insulating layer or an adhesive layer of a base material/substrate such as a single-layer or multi-layer printed circuit board, a flexible printed circuit board, a CCL (copper clad laminate) or FCCL (flexible copper clad laminate) base material.

Use of Compositions as Uncured Sheet or Partially Cured Sheet

An uncured sheet or partially cured sheet of the composition of the present invention may be suitably used as an electrically insulating material for high frequencies. For example, the sheet may be suitably used as a build-up film, a bonding sheet, a coverlay sheet, a bump sheet for flip chip bonders, or an insulating layer or adhesive layer for substrates. The sheet is used as a substitute for the conventionally used epoxy resin or silicone resin sheets, and may be cured to form a cured insulating layer or cured matrix phase having a low dielectric constant and low dielectric loss. The thickness of the sheet is generally 1 to 300 microns. The sheet may contain a woven fabric or non-woven fabric of glass cloth or ceramic fiber, may be used for impregnation, or may be multilayered with the fabric. Further, as an antenna cable for mobile phones or the like, a flexible and bendable wiring partially or wholly insulated with the sheet may be used instead of the conventional coaxial cable. For example, using an LCP (liquid crystal polymer), a PPE sheet, a fluororesin, or a polyimide resin as a base material, wiring is coated with the sheet or B stage sheet (coverlay sheet) of the present invention. The sheet is then cured and adhered to the base material for use as an insulating material.

The multilayer wiring board having an insulating layer of the cured product obtained by using the composition of the present invention may be a wiring board having a small dielectric loss and excellent high frequency properties. In this case, the merits include heat resistance that can withstand soldering, and a certain degree of softness, elongation, and impact resistance that may withstand stress due to heat cycle or thermal expansion difference, in addition to low dielectric loss. For example, a core material such as a cloth made of glass or quartz, a non-woven fabric, a film material, a ceramic substrate, a glass substrate, a general-purpose resin plate of epoxy, and a general-purpose laminated plate, and a conductor foil with an insulating layer made of the cured product are laminated and pressed to prepare a wiring board. Alternatively, a slurry or solution containing the present composition may be applied to a core material, dried and cured to form an insulating layer. The thickness of the insulating layer is generally 1 to 300 microns. Such a multi-layer wiring board may be multilayered or integrated for use.

The cured product obtained by curing the composition of the present invention in a varnish form, in particular, may be suitably used as an electrically insulating material as described above. In particular, the cured product may be used as an electrically insulating material, particularly as an electrically insulating material for high frequencies, including as a potting material, a surface coating agent, a coverlay, a solder resist, a build-up material, an underfill material, a filling insulator, an interlayer insulator, and an interlayer adhesive, or as a cured product for a printed circuit board, a flexible printed circuit board, or a FCCL (flexible copper clad laminate) base material, or as a cured product for a build-up film, a bonding sheet, a coverlay sheet, or a bump sheet for flip tip bonders.

From another point of view, the present invention relates to an electrically insulating material containing an olefin-aromatic vinyl compound-aromatic polyene copolymer, and having a storage elastic modulus at 300° C. of $5 \times 10^5$ Pa or more, and a dielectric constant of 2.5 or less and 2.0 or more and a dielectric tangent of 0.003 or less and 0.0005 or more at 23° C. and 10 GHz.

The uncured or semi-cured thermoplastic composition of the present invention may be adhered to a metal foil, particularly to a copper foil for wiring by heating under pressure without application of an adhesive or without adhesive treatment. Here, the copper foil includes copper wiring, and the shape thereof is optional. In particular, a peel strength of 1 N/mm or more in the measurement according to the Japanese Industrial Standards (JIS) C6481: 1996 may be imparted in the case where the olefin-aromatic vinyl compound-aromatic polyene copolymer has an aromatic vinyl compound content of 10 mass % or more, and/or the olefin is ethylene alone or the mass ratio of the olefin monomer component other than ethylene to the ethylene monomer component contained in the olefin is 1/7 or less. Furthermore, it is more preferable to impart a peel strength of 1.3 N/mm or more. More preferably, the peel strength may be further improved in the case where the copolymer includes ethylene alone as olefin, or the content of olefin monomer components other than ethylene is 1/10 or less relative to the ethylene monomer component contained in the olefin, most preferably the content of α-olefin monomer units other than ethylene contained in the copolymer is 4 mass % or less, or the olefin is ethylene alone. In general, it is known that the dielectric properties of a laminate such as copper-clad laminate are degraded by an adhesive or adhesive treatment. It is therefore preferable that a peel strength of 1 N/mm or more be imparted in the measurement in accordance with Japanese Industrial Standards (JIS) C6481: 1996 without such a treatment. As described above, the uncured or semi-cured thermoplastic composition of the present invention may be adhered to the copper foil for wiring by a curing treatment such as heating under pressure, without application of an adhesive or an adhesive treatment. However, in the present invention, with respect to imparting adhesiveness to copper foil and other members, other adhesiveness-imparting measures (application of an adhesive, adhesive treatment, etc.) including addition of the "surface modifier" may be implemented without any preclusion.

In another embodiment of the present invention, it is possible to provide a curable composition comprising an olefin-aromatic vinyl compound-aromatic polyene copolymer satisfying the following conditions (1) to (4), and a monomer in an amount of more than 0 parts by mass and 10 parts by mass or less relative to 100 parts by mass of the copolymer, wherein the monomer is one or more selected from the group consisting of an aromatic vinyl compound, an aromatic polyene monomer, and a polar monomer.

(1) The number average molecular weight of the copolymer is 5000 or more and 100000 or less.

(2) The aromatic vinyl compound monomer of the copolymer is an aromatic vinyl compound having 8 or more and 20 or less carbon atoms, and the content of the aromatic vinyl compound monomer unit is 0 mass % or more and 70 mass % or less.

(3) The aromatic polyene is one or more selected from polyenes having 5 or more and 20 or less carbon atoms and having a plurality of vinyl groups and/or vinylene groups in the molecule, and the content of the vinyl groups and/or the vinylene groups derived from the aromatic polyene unit is 1.5 pieces or more and less than 20 pieces per number average molecular weight.

(4) The olefin is one or more selected from olefins having 2 or more and 20 or less carbon atoms, and the total of the olefin monomer unit, the aromatic vinyl compound monomer unit, and the aromatic polyene monomer unit is 100 mass %.

More preferably, the monomer may be a polar monomer.

Further, an electrically insulating material being a cured product obtained by curing the curable composition, wherein the electrically insulating material has a storage elastic modulus at 300° C. of $5 \times 10^5$ Pa or more, preferably $1 \times 10^6$ Pa or more, and a dielectric constant of 2.5 or less and 2.0 or more and a dielectric tangent of 0.003 or less and 0.0005 or more at 23° C. and 10 GHz, may be also provided.

The curable composition may contain one or more selected from the group consisting of the solvent, curing agent, filler, flame retardant, and surface modifier as with the case of the curable composition containing an olefin-aromatic vinyl compound-aromatic polyene copolymer and a resin (hereinafter, simply referred to as the composition with a resin). The curable composition may be molded into various shapes including a sheet as with the composition with the resin by taking advantage of thermoplasticity. The curable composition may be used as a varnish together with a solvent as with the composition with the resin. The present invention relates to a cured product obtained by curing the curable composition, and may exhibit various physical properties similar to those of the cured product of the composition with the resin. The curable composition may be made into a laminate including a layer containing a curable composition and a copper foil as with the composition with the resin, and may be also made into a cured product by curing the laminate.

The composition according to the above-described embodiment of the present invention, or the composition according to the other embodiment, may be also cured together with an LCP (liquid crystal polymer) layer under relatively mild curing conditions, such that high adhesive strength may be imparted. Here, the LCP layer may be specifically an LCP sheet or film. Therefore, for example, various laminates including an LCP sheet, a metal foil, preferably a copper foil, and the composition of the present invention may be obtained. The number of layers of the laminate and the order of lamination are optional. As such an example in the present invention, the composition of the present invention is useful as an adhesive layer between a metal foil (copper foil) and an LCP sheet. The composition of the present invention may exhibit high adhesiveness to both a metal foil and an LCP sheet. Conventionally, adhesion between an LCP sheet and a copper foil has required heating to the melting point of LCP (approximately 280° C. to 330° C. or a temperature close thereto) and pressure bonding. However, by using the composition of the present invention as an adhesive layer, an LCP and a metal foil may be pressure bonded at a lower temperature substantially in the vicinity of curing temperature of the composition of the present invention. On this occasion, the low dielectric constant and the low dielectric tangent value of the cured product of the composition of the present invention impart usefulness to the laminate as wiring for high-frequency signal transmission, in particular. Another example of the present laminate include a structure for covering metal wiring, preferably copper wiring, arranged on an LCP layer, with a layer of the cured product of the composition of the present invention from the side opposite to the LCP layer side. In other words, the use is a so-called coverlay on an LCP board wiring.

Here, the LCP (liquid crystal polymer) refers to a thermoplastic polymer having a liquid crystal state or optical birefringent properties when melted. Examples of the LCP include a lyotropic liquid crystal polymer that exhibits liquid crystallinity in a solution state and a thermotropic liquid crystal polymer that exhibits liquid crystallinity when melted. The liquid crystal polymer is classified into type I, type II, and type III according to the thermal deformation temperature, and any type may be used. Examples of the liquid crystal polymer include a thermoplastic aromatic liquid crystal polyester, and a thermoplastic aromatic liquid crystal polyester amide having an amide bond introduced into the polyester. The LCP may be a polymer further having an imide bond, a carbonate bond, a carbodiimide bond, or an isocyanurate bond derived from an isocyanate, which is introduced into an aromatic polyester or an aromatic polyester amide. As the LCP, a molten liquid crystal-forming polyester including 2-hydroxy-6-naphthoic acid and para-hydroxybenzoic acid, for example, an LCP resin manufactured by UENO FINE CHEMICALS INDUSTRY, LTD. (product number A-5000, melting point: 280° C.), may be used.

The melting point of the LCP is preferably 220 to 400° C., more preferably 260 to 380° C., by the DSC method. With a melting point within the above range, a film or sheet excellent in extrusion moldability and heat resistance may be obtained. Such an LCP may be obtained from, for example, UENO FINE CHEMICALS INDUSTRY, LTD., Sumitomo Chemical Co., Ltd., or POLYPLASTICS CO., LTD. Here, the LCP sheet is a known LCP sheet, and the thickness thereof is optional. The LCP sheet may be obtained by a known method such as a T-die extrusion method, an inflation method, and an endless belt (double belt press) method.

EXAMPLES

Hereinafter, the present invention will be described with reference to Examples, though the present invention is not limited to the following Examples.

The copolymers obtained in synthetic examples and comparative synthetic examples were analyzed by the following means.

The content of vinyl group units derived from ethylene, hexene, styrene, and divinylbenzene in a copolymer was determined by $^1$H-NMR based on the peak area intensity assigned to each. The sample was dissolved in heavy 1,1,2,2-tetrachloroethane, and the measurement was performed at 80 to 130° C.

As molecular weight, the number average molecular weight (Mn) in terms of standard polystyrene was determined by GPC (gel permeation chromatography). The measurement was performed under the following conditions. In the case where the number average molecular weight is 1000 or more:

Column: Two TSK-GEL Multipore HXL-M having a diameter of 7.8 mm and a length of 300 mm (manufactured by Tosoh Corporation) were connected in series for use.
Column temperature: 40° C.
Solvent: THF
Liquid flow rate: 1.0 ml/min.
Detector: RI detector (differential refractive index detector)

In the case where a copolymer was hardly dissolved in a THF solvent, for example, in the case where an ethylene-styrene-divinylbenzene copolymer had a styrene content of lower than 40 mass %, the molecular weight in terms of standard polystyrene was determined by the following high-temperature GPC method. The measurement was performed under the following conditions.

Apparatus: HLC-8121GPC/HT manufactured by Tosoh Corporation
Column: Three pieces of TSKgelGMHHR-H (20) HT having a diameter of 7.8 mm and a length of 300 mm
Column temperature: 140° C.
Detector: RI
Solvent: ortho dichlorobenzene
Liquid flow rate: 1.0 ml/min
Sample concentration: 0.1 wt/vol %
Sample injection volume: 100 μL Tensile Test In accordance with JIS K-6251: 2017, a film sheet with a thickness of about 1 mm was cut into the shape of No. 2 dumbbell No. 1/2 type test piece. By using Tensilon UCT-1T manufactured by ORIENTEC CORPORATION, measurement was performed at 23° C. and a tensile speed of 500 mm/min to determine the tensile elastic modulus, the tensile strength at break, and the tensile elongation at break.

DSC Measurement

The DSC measurement was performed by using a DSC6200 manufactured by Seiko Instruments Inc. under nitrogen gas flow. That is, 10 mg of resin and 10 mg of α-alumina as reference were heated from room temperature to 240° C. at a heating rate of 10° C./min and then cooled to −120° C. at a rate of 20° C./min by using an aluminum pan under nitrogen atmosphere. After that, DSC measurement was performed while raising the temperature to 240° C. at a heating rate of 10° C./min to determine the glass transition temperature. The glass transition temperature referred to here is the extrapolated glass transition start temperature of JIS K7121: 2012, which is the temperature at the intersection between the straight line extending from the baseline on the low temperature side to the high temperature side and the tangent line drawn at a point where the gradient of the curve of the stepwise change portion of the glass transition is maximized.

Measurement of Storage Elastic Modulus and Cross-Linking Density

Using a dynamic viscoelasticity measuring apparatus (RSA-III manufactured by Rheometric Scientific), measurement was performed at a frequency of 1 Hz in a temperature range of −60° C. to +300° C. A measurement sample (3 mm×40 mm) cut out from a film having a thickness of about 0.1 mm to 0.3 mm was subjected to measurement for determining the storage elastic modulus. The main measurement parameters related to the measurement are as follows.

Measurement frequency: 1 Hz
Rate of temperature rise: 3° C./min
Measurement length of sample: 13 mm
Test Type=Dynamic Temperature Ramp (DTempRamp)
Initial Static Force: 5.0 g Auto Tension Sensitivity: 1.0 g
Max Auto Tension Rate: 0.033 mm/s
Max Applied Strain: 1.5%
Min Allowed Force: 1.0 g
Distortion: 0.1%

Coefficient of Water Absorption

Measurement was performed in accordance with ASTM D570-98.

Dielectric Constant and Dielectric Loss (Dielectric Tangent)

A sample with sizes of 1 mm×1.5 mm×80 mm cut out from a sheet was used for the measurement of the dielectric constant and dielectric tangent by a cavity resonator perturbation method (8722ES type network analyzer manufactured by Agilent Technologies Japan, Ltd., and cavity resonator manufactured by KANTO Electronic Application and Development Inc.), at 23° C. and 10 GHz.

Volume Resistivity

A film having a thickness of about 0.5 mm was used for the measurement at room temperature in accordance with JIS K6911: 2006.

Olefin-Aromatic Vinyl Compound-Aromatic Polyene Copolymer

With reference to the production methods in Japanese Patent Laid-Open No. 2009-161743, Japanese Patent Laid-Open No. 2010-280771 and International Publication No. WO 00/37517, the monomer amount, ratio, polymerization pressure and polymerization temperature were appropriately changed to obtain copolymers P-1 to P-4. The total of the olefin monomer unit, the aromatic vinyl compound monomer unit, and the aromatic polyene monomer unit was set to 100 mass %. In Table 1, the composition, the number average molecular weight, and the glass transition temperature of the copolymer are shown.

The raw materials are as follows.

As divinylbenzene, divinylbenzene (meta and para mixture, divinylbenzene purity: 81%) manufactured by NIPPON STEEL Chemical & Steel Co., Ltd. was used. As bifunctional polyphenylene ether oligomer (OPE-2St, number average molecular weight: 1200), a powdered polyphenylene ether oligomer for use was obtained by further diluting a toluene solution product manufactured by Mitsubishi Gas Chemical Company, Inc. with toluene, adding a large amount of methanol thereto to cause methanol precipitation, air-drying, and then drying under reduced pressure. As SEBS, Tuftec H-1041 (number average molecular weight: 58000) manufactured by Asahi Kasei Chemicals Corporation was used. As 1,2-polybutadiene, liquid polybutadiene manufactured by Nippon Soda Co., Ltd., product name B-3000 (number average molecular weight: 3200) was used. As curing agent, dicumyl peroxide manufactured by NOF CORPORATION (trade name "Percumyl D") or 2,5-dimethyl-2,5-bis(t-butylperoxy)hexyne-3 (trade name "Perhexyne 25B") was used.

TABLE 1

| Copolymer | Ethylene content mass % | 1-Hexene content mass % | Styrene content mass % | Divinylbenzene vinyl group (Piece per Number average molecular weight) | Number average molecular weight Mn | Glass transition temperature ° C. |
|---|---|---|---|---|---|---|
| P-1 | 46 | 0 | 53 | 2.4 | 68000 | −8 |
| P-2 | 59 | 0 | 40 | 3.5 | 47000 | −15 |
| P-3 | 47 | 3.8 | 48 | 3.5 | 37000 | −18 |
| P-4 | 67 | 0 | 30 | 10.6 | 48000 | −15 |

TABLE 2

| | Example 1 | Example 2 | Example 3 | Example 4 | Example 5 | Example 6 |
|---|---|---|---|---|---|---|
| P1 | 100 | | | | | |
| P2 | | 100 | 100 | | | |
| P3 | | | | 100 | | |
| P4 | | | | — | 100 | 100 |
| Monomer 1 Styrene | 5 | | | — | — | — |
| Monomer 2 Vinylnaphthalene | | | | — | — | — |
| Monomer 3 Divinylbenzene | 4 | | | — | 5 | — |
| Bifunctional polyphenylene ether oligomer (OPE-2St) | 70 | 70 | 50 | — | 70 | 90 |
| 1,2-Polybutadiene | | | 20 | 20 | — | — |
| Tuftec H-1041 (SEBS) | | | | 20 | | |
| Solvent | | | | — | — | — |
| Curing agent | 1 part by mass* | 1 part by mass* | 1 part by mass* | 1 part by mass* | 1 part by mass* | 1 part by mass* |
| Properties of composition (room temperature) | Semi-hard resin state | Soft resin state | Soft resin state | Soft resin state | Semi-hard resin state | Soft resin state |
| Storage elastic modulus (300° C.)/Pa | $2.0 \times 10^6$ | $2.1 \times 10^6$ | $1.9 \times 10^6$ | $1.5 \times 10^6$ | $2.6 \times 10^6$ | $2.3 \times 10^6$ |
| Tensile elastic modulus/MPa | 160 | 180 | 85 | 18 | 370 | 210 |
| Volume resistivity/ Ω · cm | $8 \times 10^{15}$ | $5 \times 10^{15}$ | $4 \times 10^{15}$ | $5 \times 10^{15}$ | $8 \times 10^{15}$ | $2 \times 10^{15}$ |

TABLE 2-continued

| | | | | | | |
|---|---|---|---|---|---|---|
| Dielectric constant | 2.3 | 2.4 | 2.2 | 2.3 | 2.3 | 2.4 |
| Dielectric tangent | 0.0018 | 0.0011 | 0.0014 | 0.0020 | 0.0010 | 0.0011 |
| Coefficient of water absorption/mass % | <0.1 | <0.1 | <0.1 | <0.1 | <0.1 | <0.1 |

| | Example 7 | Example 8 | Comparative Example 1 | Comparative Example 2 | Comparative Example 3 | Comparative Example 4 |
|---|---|---|---|---|---|---|
| P1 | | | 100 | | | |
| P2 | | 100 | | | | |
| P3 | — | | | | | |
| P4 | 100 | | | | | |
| Monomer 1 Styrene | — | | — | | | |
| Monomer 2 Vinylnaphthalene | — | | — | | | |
| Monomer 3 Divinylbenzene | — | | — | | | |
| Bifunctional polyphenylene ether oligomer (OPE-2St) | 50 | 70 | — | 100 | 70 | |
| 1,2-Polybutadiene | 30 | | — | | 30 | |
| Tuftec H-1041 (SEBS) | 10 | | | | | 100 |
| Solvent | 200 (Mesitylene) | 200 (Mesitylene) | — | 200 (Mesitylene) | 200 (Mesitylene) | 200 (Mesitylene) |
| Curing agent | 1 part by mass* | 1 part by mass* | 1 part by mass* | 1 part by mass* | 1 part by mass* | 1 part by mass* |
| Properties of composition (room temperature) | Varnish state | Varnish state | Soft resin state | Varnish state | Varnish state | Varnish state |
| Storage elastic modulus (300° C.)/Pa | $1.8 \times 10^6$ | $2.0 \times 10^6$ | Fractured, unmeasurable★ | Unmeasurable due to occurrence of many cracks in cured product. | Unmeasured | Unmeasured |
| Tensile elastic modulus/MPa | 54 | 160 | Unmeasured | | Unmeasured | Unmeasured |
| Volume resistivity/Ω · cm | $3 \times 10^{15}$ | $6 \times 10^{15}$ | Unmeasured | | Unmeasured | Unmeasured |
| Dielectric constant | 2.3 | 2.3 | Unmeasured | | 2.5 | 2.6 |
| Dielectric tangent | 0.0012 | 0.0012 | Unmeasured | | 0.0033 | 0.005 |
| Coefficient of water absorption/mass % | <0.1 | <0.1 | Unmeasured | | Unmeasured | Unmeasured |

Formulation in table is shown in parts by mass..
★During measurement, semi-melting and fracture occurred at 250° C., at storage elastic modulus of about $3 \times 10^5$ Pa.
*1 part by mass was added relative to 100 parts by mass of raw materials other than curing agent in total.

Example 1

In a Brabender Plasti-Corder (PL2000 type manufactured by Brabender GmbH & Co. KG), a composition of resin P-1 (ethylene-styrene-divinylbenzene copolymer), a monomer and a resin shown in Table 2 (formulation in the table shown in parts by mass) kneaded in advance was placed to be kneaded at 120° C., at a rotation speed of 30 rpm for 10 minutes. Further, 1 part by mass of a curing agent (dicumyl peroxide, manufactured by NOF CORPORATION) was added to 100 parts by mass of the composition of resin and monomer, and the mixture was kneaded under the present conditions for 5 minutes to prepare a composition. The resulting composition was sandwiched between two Teflon (registered trademark) sheets in a mold, closely contacted, sealed, and pressed by a hot press method (120° C., time: 5 minutes, pressure: 5 MPa) to obtain sheets (uncured sheets) having various thicknesses (thickness: 1.0 mm, 0.5 mm, etc.). The resulting sheet together with Teflon (registered trademark) sheets was sandwiched between glass plates, closely contacted thereto under load applied, and heat-treated at 120° C. for 30 minutes, 150° C. for 30 minutes, and then at 180° C. for 120 minutes so as to be cured. After curing, the glass plates, Teflon (registered trademark) sheets and the mold were removed to obtain a cured product in film form of the composition of the present invention.

Examples 2 to 6 and Comparative Example 1

Compositions were prepared according to the same procedure as in Example 1 with the formulations shown in Table 2 (the formulations in the table are shown in parts by mass). Press-molding and curing were performed in the same manner as in Example 1. However, in Example 5, raw materials other than curing agent were kneaded at 100° C., at a rotation speed of 50 rpm for 10 minutes, and then a curing agent (dicumyl peroxide) was added thereto. Further, kneading was performed under these conditions for 5 minutes. In Example 4, perhexyne 25B was used as a curing agent. In Example 3, Example 4, and Example 7 which will be described later, 1,2-polybutadiene was added before addition of the curing agent. The properties of any of the compositions of Examples 1 to 6 and Comparative Example 1 before curing (at room temperature) were in a sheet form in a soft resin state or semi-hard resin state, easy to handle as sheet. After pressing, the sheet peeled off from the Teflon (registered trademark) sheet had low self-adhesiveness, and was able to be handled as a single sheet. In Examples satisfying the preferred conditions of the present invention, the moldability as a thermoplastic resin in an uncured state was easy.

Examples 7 and 8, and Comparative Examples 2 to 4

Raw materials other than curing agent were fed into a container provided with a heating/cooling jacket and a stirring blade according to the formulation shown in Table 2, and the mixture was heated to 60° C. and stirred to obtain a composition in a varnish form (viscous state). Then, a curing agent was added, stirred and dissolved. As the curing agent, dicumyl peroxide was used. The resulting composition in a varnish form was poured into a Teflon (registered trademark) mold on a Teflon (registered trademark) sheet, and the solvent was sufficiently evaporated at about 100° C. with a blower dryer and then under reduced pressure. Subsequently, the mold made of Teflon (registered trademark) was carefully removed to obtain a sheet in a soft resin state. The resulting sheet was sandwiched between two Teflon (registered trademark) sheets in a mold, closely contacted, sealed, and pressed by a hot press method (120° C., time: 5 minutes, pressure: 1.5 MPa) to obtain sheets (uncured sheets) having various thicknesses (thickness: 1.0 mm, 0.5 mm, etc.). The sheet was easy to handle. The sheet peeled off from the Teflon (registered trademark) sheet had low self-adhesiveness, and was able to be handled as a single sheet. In other words, the moldability as a thermoplastic resin in an uncured state was easy. The resulting sheet together with Teflon (registered trademark) sheets was sandwiched between glass plates, closely contacted thereto under load applied, and heat-treated at 120° C. for 30 minutes, 150° C. for 30 minutes, and then at 200° C. for 120 minutes so as to be cured. After curing, the glass plates, Teflon (registered trademark) sheets and the mold were removed to obtain a cured product in sheet form of the composition of the present invention.

In viscoelastic spectrum measurement of the cured products of the sheets obtained in Examples 1 to 8, the elastic modulus was able to be measured without melt fracture even at 300° C., and the storage elastic modulus at 300° C. (573 K) was $5 \times 10^5$ Pa or more. Further, any of the cross-linking densities determined from the storage elastic modulus at 300° C. (573 K) was more than $3 \times 10^5$ mol/cm$^3$, indicating that the cross-linking had sufficiently progressed. In addition, any of them had a tensile elastic modulus of less than 3 GPa and 3 MPa or more. Further, any of the tensile strength at break was 5 MPa or more and less than 50 MPa, and any of the tensile elongation at break was 50% or more and less than 250%. The dielectric constant and the dielectric tangent also were in the scope of the present invention. Any of the cured product in sheet form obtained in Examples 1 to 8 had a coefficient of water absorption of less than 0.1 mass %, and a volume resistivity of $1 \times 10^{15}$ Ω·cm or more. The cured products in sheet form obtained in Examples 1 to 8 had good low dielectric properties including a dielectric constant of 2.5 or less and 2.0 or more and a dielectric tangent of 0.003 or less and 0.0005 or more measured at 10 GHz. The cured product of the sheet obtained in Comparative Example 1 did not satisfy the conditions of the present invention including the storage elastic modulus at 300° C. and cross-linking density. Since the sheet obtained in Comparative Example 2 had a large number of cracks and was unsuitable for use as an insulating material, various physical properties were not measured. Since the sheets obtained in Comparative Examples 3 and 4 did not satisfy the preferred ranges of the dielectric constant and the dielectric tangent of the present invention, no other evaluation was performed.

Peel Strength from Roughened Surface of Copper Foil

The copper foil manufactured by MITSUI MINING & SMELTING CO., LTD. (VSP series, TQ-M7-VSP, thickness: 12 μm) was used. On an uncured sheet having a thickness of 0.3 mm obtained by press molding the composition in Example 1 at 120° C., at 5 MPa for 2 minutes, the copper foil was placed such that the roughened surface of the foil was in contact with the sheet. Using a mold having a thickness of 0.3 mm, the sheet and the copper foil were adhered and cured by heating under pressure with a hot pressing machine at a pressure of 5 MPa, at 120° C. for 30 minutes, then 150° C. for 30 minutes, and then 200° C. for 120 minutes. The measurement of peel strength from the copper foil was evaluated by 90° peeling in accordance with Japanese Industrial Standards (JIS) C6481: 1996. As a result, the peel strength was 2.3 N/mm. The peel strength of the composition in Example 4 from the copper foil was 1.5 N/mm, in the similar measurement.

Synthesis of Ethylene-Styrene-Divinylbenzene Copolymerized Oligomer

By referring to the manufacturing method described in Japanese Patent Laid-Open No. 9-40709, in an autoclave having a capacity of 10 L, provided with a stirrer and a heating/cooling jacket, polymerization was performed using dimethylmethylene biscyclopentadienyl zirconium dichloride as a catalyst, methylalumoxane (manufactured by Tosoh Finechem Corporation, MMAO-3A toluene solution) as a co-catalyst, cyclohexane as solvent, and styrene, divinylbenzene, and ethylene as raw materials, with the amount of monomer, ratio, polymerization pressure, and polymerization temperature appropriately changed. Into the resulting polymerization solution, 1-isopropanol was fed, and then a large amount of methanol was fed in the presence of a polymerization inhibitor to collect a copolymerized oligomer. The copolymerized oligomer O-1 was vacuum dried at 50° C. for 2 days and nights.

Olefin-Aromatic Vinyl Compound-Aromatic Polyene Copolymer

By reference to the production methods of Japanese Patent Laid-Open No. 2009-161743 and Japanese Patent Laid-Open No. 2010-280771, a copolymer P-5 was obtained by appropriately changing the amount of monomer, ratio, polymerization pressure, and polymerization temperature. The total of the olefin monomer unit, the aromatic vinyl compound monomer unit, and the aromatic polyene monomer unit was set to 100 mass %. In Table 3, the composition, the number average molecular weight, and the glass transition temperature of the resulting O-1 and P-5 are shown.

As bismaleimide, BMI-1500 manufactured by Designer Molecules Inc. was used.

As silica, fused silica manufactured by Denka Company Limited, SFP-130MC (d50=0.6 μm, specific surface area: 6.2 m$^2$/g, true specific gravity: 2.26 g/cm$^3$) was used without pretreatment.

TABLE 3

| Co-polymer/oligomer | Ethylene content mass % | Styrene content mass % | Divinylbenzene vinyl group (Piece per Number average molecular weight) | Number average molecular weight Mn | Glass transition temperature ° C. |
|---|---|---|---|---|---|
| P-5 | 48 | 51 | 4.3 | 46000 | −9 |
| O-1 | 54 | 35 | 3.1 | 3800 | −10 |

Examples 9 and 10

Into a container provided with a heating/cooling jacket and a stirring blade, raw materials other than curing agent were fed according to the formulation shown in Table 4, and the mixture was heated to 60° C. and stirred to obtain a composition in a varnish form (viscous liquid). Then, a curing agent was added, and the mixture was stirred and dissolved. Perhexyne 25B was used as the curing agent. The resulting composition in a varnish state was poured into a mold of Teflon (registered trademark) on a Teflon (registered trademark) sheet, and the solvent was sufficiently evaporated at about 60° C. with a blower dryer and then under reduced pressure. The resulting sheet together with the Teflon (registered trademark) sheet was sandwiched between mirror surface metal sheets, closely contacted thereto under load applied, and heat-treated at 120° C. for 30 minutes, 150° C. for 30 minutes, and then at 200° C. for 120 minutes so as to be cured. After curing, the metal plates, Teflon (registered trademark) sheets and the mold were removed to obtain a cured product in sheet form of the composition of the present invention.

Example 11

To a composition in a varnish form obtained in the same manner as in Examples 9 and 10, silica filler (50 vol % of silica filler relative to 50 vol % of resin component) was added and further stirred. The resulting varnish in a slurry state was further stirred with Awatori Rentaro (manufactured by THINKY CORPORATION), and poured into a mold of Teflon (registered trademark) on a Teflon (registered trademark) sheet. The solvent was sufficiently evaporated at about 60° C. with a blower dryer and then under reduced pressure. The resulting sheet together with the Teflon (registered trademark) sheet was sandwiched between mirror surface metal sheets, closely contacted thereto under load applied, and heat-treated at 120° C. for 30 minutes, 150° C. for 30 minutes, and then at 200° C. for 120 minutes so as to be cured. After curing, the metal plates, Teflon (registered trademark) sheets and the mold were removed to obtain a cured product in sheet form of the composition of the present invention.

factured by UENO FINE CHEMICALS INDUSTRY, LTD. (product number A-5000, melting point: 280° C.) having a thickness of 100 μm obtained by the method described in International Publication No. WO 2020/153391 was used as LCP sheet. A 100 μm sheet was used. A varnish was applied onto the LCP sheet, and the solvent was first removed by air drying at 60° C., and then sufficiently and carefully removed under normal pressure to vacuum at 60° C. without foaming. The thickness of the varnish layer after removal of the solvent was about 30 μm. The roughened surface of the copper foil was closely contacted with the varnish side of the sheet from which the solvent had been removed. While applying a pressure of 5 MPa under vacuum with a pressing machine, curing was performed through heat treatment at 120° C. for 30 minutes, 150° C. for 30 minutes, and then at 180° C. for 120 minutes. A sheet having a width of 10 mm and a length of 100 mm was cut out and the measurement of peel strength between the LCP sheet and the copper foil was evaluated by 90° peeling in accordance with Japanese Industrial Standards (JIS) C6481: 1996. In the case of using the varnish obtained in Example 9, the peel strength was 1.4 N/mm. In the case of using the varnish obtained in Example 10, the peel strength was 1.3 N/mm. Through observation of the stripped surface, peeling at the interface between the cured product derived from varnish and the LCP sheet was found, so that it was concluded that the peel strength between the LCP sheet and the cured product derived from varnish were 1.4 N/mm and 1.3 N/mm, respectively. In

TABLE 4

| | Example 9 | Example 10 | Example 11 |
|---|---|---|---|
| Copolymer P-5 | 100 | 100 | 100 |
| Copolymerized oligomer O-1 | 40 | — | — |
| Bifunctional polyphenylene ether oligomer (OPE-2St) | — | — | 100 |
| Bismaleimide (BMI-1500 manufactured by Designer Molecules Inc.) | — | 8 | — |
| Solvent (toluene) | 250 | 200 | 400 |
| Silica filler (SFP-130MC) | — | — | 452 (50 vol %) |
| Curing agent Perhexyne25B | 1 part by mass* | 1 part by mass* | 1 part by mass* |
| Properties of curable resin composition (room temperature) | Soft resin state | Soft resin state | Hard resin state |
| Storage elastic modulus (300° C.)/Pa | $1.6 \times 10^6$ | $1.5 \times 10^6$ | $2.3 \times 10^8$ |
| Tensile elastic modulus/MPa | 15 | 20 | 2400 |
| Volume resistivity/Ω·cm | $>10^{15}$ | $>10^{15}$ | $>10^{15}$ |
| Dielectric constant | 2.3 | 2.4 | 2.9 |
| Dielectric tangent | 0.0012 | 0.0018 | 0.0022 |
| Coefficient of water absorption/mass % | <0.1 | <0.1 | <0.1 |

Formulation in table is shown in parts by mass.
*1 part by mass was added relative to 100 parts by mass of raw materials other than curing agent in total.

Any of the cured products obtained in Examples 9 and 10 and the cured product containing filler obtained in Example 11 satisfied the conditions of the cured product of the present invention.

Examples 12 and 13

Evaluation as an Adhesive Between Copper Foil and LCP (Liquid Crystal Polymer) Sheet Using the varnishes obtained in Examples 9 and 10, the adhesiveness between a copper foil and an LCP sheet was evaluated as follows. The copper foil described above was used as copper foil, and a sheet made of LCP resin manuaddition, it was concluded that the peel strength of the copper foil and the cured product derived from varnish were higher than the above values in the same test pieces.

Comparative Example 5

Using only a copper foil and an LCP sheet, pressure thermal bonding was performed with a pressing machine under the same conditions as in Examples. The two did not substantially adhere to each other.

Examples in Second Aspect

Based on the following raw materials, copolymers P-1a to P-4a in a second aspect having formulations shown in Table 5 were prepared by the production method described above.

As divinylbenzene, divinylbenzene (meta and para mixture, divinylbenzene purity: 81%) manufactured by NIPPON STEEL Chemical & Steel Co., Ltd. was used. BVPE (1,2-bis(vinylphenyl)ethane) for use was synthesized by the synthesis method described in Japanese Patent Laid-Open No. 2003-212941. The BVPE was a mixture of m-m, m-p and p-p. As 1,2-PBd, B-3000 manufactured by Nippon Soda Co., Ltd., was used. As bifunctional polyphenylene ether oligomer (OPE-2St, number average molecular weight: 1200), a powdered polyphenylene ether oligomer for use was obtained by further diluting a toluene solution product manufactured by Mitsubishi Gas Chemical Company, Inc. with toluene, adding a large amount of methanol thereto to cause methanol precipitation, air-drying, and then drying under reduced pressure. As SEBS, H-1041 manufactured by Asahi Kasei Chemicals Corporation was used. As curing agent, dicumyl peroxide manufactured by NOF CORPORATION (trade name "Percumyl D") was used.

kneaded in advance were placed to be kneaded at 100° C., at a rotation speed of 50 rpm for 5 minutes. Further, 1 part by mass of a curing agent (dicumyl peroxide, manufactured by NOF CORPORATION) was added to 100 parts by mass of the copolymer and monomer in total, and the mixture was kneaded under conditions at 100° C., at a rotation speed of 50 rpm for 5 minutes to prepare a composition. The resulting composition was sandwiched between two Teflon (registered trademark) sheets in a mold, closely contacted, sealed, and pressed by a hot press method (120° C., time: 5 minutes, pressure: 5 MPa) to obtain sheets (uncured sheets) having various thicknesses (thickness: 1.0 mm, 0.5 mm, etc.). The resulting sheet together with Teflon (registered trademark) sheets was sandwiched between glass plates, closely contacted thereto under load applied, and heat-treated at 120° C. for 30 minutes, 150° C. for 30 minutes, and then at 180° C. for 120 minutes so as to be cured. After curing, the glass plates, Teflon (registered trademark) sheets and the mold

TABLE 5

| Copolymer | Ethylene content mass % | 1-Hexene content mass % | Styrene content mass % | Divinylbenzene vinyl group (Piece per Number average molecular weight) | Number average molecular weight Mn | Glass transition temperature ° C. |
|---|---|---|---|---|---|---|
| P-1a | 46 | 0 | 53 | 2.4 | 68000 | −8 |
| P-2a | 59 | 0 | 40 | 3.5 | 47000 | −15 |
| P-3a | 62 | 20 | 15 | 3.5 | 15000 | −47 |
| P-4a | 64 | 10 | 25 | 2.4 | 24000 | −47 |

In Table 6, formulations, etc., of each of Examples and Comparative Examples are shown.

were removed to obtain a cured product in film form of the composition of the present invention.

TABLE 6

| | Example 1a | Example 2a | Example 3a | Example 4a | Comparative Example 1a | Comparative Example 2a |
|---|---|---|---|---|---|---|
| P-1a | 100 | — | — | — | — | — |
| P-2a | — | 100 | 100 | 100 | — | — |
| P-3a | — | — | — | — | 100 | — |
| P-4a | — | — | — | — | — | 100 |
| Monomer 1 Styrene | 4 | — | — | — | — | 20 |
| Monomer 2 Vinylnaphthalene | — | 5 | — | — | 20 | — |
| Monomer 3 Divinylbenzene | 3 | 3 | — | — | — | — |
| Monomer 4 BVPE (1,2-bis(vinyl-phenyl)ethane) | — | — | 10 | — | — | — |
| Monomer 5 Triallylisocyanurate (TAIC) | — | — | — | 3 | — | — |
| Curing agent, dicumyl peroxide | 1 part by mass* | 1 part by mass* | 1 part by mass* | 1 part by mass* | 1 part by mass* | 1 part by mass* |
| Properties of curable resin composition (room temperature) | Soft resin state | Soft resin state | Soft resin state | Soft resin state | Viscous resin state | Viscous resin state |
| Storage elastic modulus (300° C.)/Pa | $1.1 \times 10^6$ | $1.4 \times 10^6$ | $2.3 \times 10^6$ | $1.3 \times 10^6$ | ★ | $1.5 \times 10^5$ |
| Crosslink density (300° C.)/mol/cm$^3$ | $7.7 \times 10^{-5}$ | $9.8 \times 10^{-5}$ | $1.6 \times 10^{-4}$ | $9.1 \times 10^{-5}$ | $2.1 \times 10^{-5}$ or less | $1.1 \times 10^{-5}$ |
| Tensile elastic modulus/MPa | 5 | 6 | 20 | 13 | 1 | 1 |
| Volume resistivity/Ω · cm | $5 \times 10^{15}$ | $3 \times 10^{15}$ | $5 \times 10^{15}$ | $2 \times 10^{15}$ | $6 \times 10^{15}$ | $3 \times 10^{15}$ |
| Dielectric constant | 2.2 | 2.3 | 2.3 | 2.5 | 2.3 | 2.1 |
| Dielectric tangent | 0.0011 | 0.0011 | 0.0013 | 0.0016 | 0.0012 | 0.0013 |
| Coefficient of water absorption/mass % | <0.1 | <0.1 | <0.1 | <0.1 | <0.1 | <0.1 |

*1 part by mass was added relative to 100 parts by mass of raw materials other than curing agent in total.
★ During measurement, semi-melting and fracture occurred at 250° C., at storage elastic modulus of about $3 \times 10^5$ Pa.

Example 1a

In a Brabender Plasti-Corder (PL2000 type manufactured by Brabender GmbH & Co. KG), a copolymer P-1a (ethylene-styrene-divinylbenzene copolymer) and a monomer Examples 2a to 4a and Comparative Examples 1a to 2a Compositions were prepared according to the same procedure as in Example 1a with the formulations shown in Table 6 (the formulations in the table are shown in parts by mass). Press-molding and curing were performed in the same manner as in Example 1a. The properties of any of the compositions of Examples 1a to 4a before curing (at room temperature) were in a sheet form in a soft resin state or semi-hard resin state, easy to handle as sheet. After pressing, the sheet peeled off from the Teflon (registered trademark) sheet had low self-adhesiveness, and was able to be handled as a single sheet. In Examples satisfying the preferred conditions of the present invention, the moldability as a thermoplastic resin in an uncured state was easy.

On the other hand, in Comparative Examples 1a and 2a, the raw materials were kneaded in advance by stirring at about 60° C. in a glass container provided with a stirrer and a hot water jacket, and a curing agent was added thereto. Under these conditions, kneading was further performed for 10 minutes. Press-molding and curing were performed in the same manner as in Example 1a. In both Comparative Examples 1a and 2a, the properties (room temperature) of the compositions obtained before curing were like viscous resin in semi-solid state. When peeled off from a release sheet (Teflon (registered trademark) sheet), the compositions had blocking properties with high self-adhesiveness, and were difficult to handle as a single sheet. Only a state sandwiched between release sheets enabled handling.

In viscoelastic spectrum measurement of the cured products of the composition sheets obtained in Examples 1a to 4a, the elastic modulus was able to be measured without melt fracture even at 300° C., and the storage elastic modulus at 300° C. (573 K) was $5 \times 10^5$ Pa or more. Further, any of the cross-linking densities determined from the storage elastic modulus at 300° C. (573 K) was more than $3 \times 10^{-5}$ mol/cm$^3$, indicating that the cross-linking had sufficiently progressed. In addition, any of them had a tensile elastic modulus of less than 3 GPa and 3 MPa or more. Further, any of the tensile strength at break was 5 MPa or more and less than 50 MPa, and any of the tensile elongation at break was 50% or more and less than 250%. The dielectric constant and the dielectric tangent also were in the scope of the present invention. Any of the sheets of cured product obtained in Examples 1a to 4a had a coefficient of water absorption of less than 0.1 mass %, and a volume resistivity of $1 \times 10^{15}$ Ω·cm or more. On the other hand, the cured product of the sheet obtained in Comparative Examples 1a and 2a had a too low tensile elastic modulus, and did not satisfy the conditions of the present invention including the storage elastic modulus at 300° C. and cross-linking density.

Peel Strength from Roughened Surface of Copper Foil

The copper foil manufactured by MITSUI MINING & SMELTING CO., LTD.(VSP series, TQ-M7-VSP, thickness: 12 μm) was used. On an uncured sheet having a thickness of 0.3 mm obtained by press molding the composition in Example 1a at 120° C., at 5 MPa for 2 minutes, the copper foil was placed such that the roughened surface of the foil was in contact with the sheet. Using a mold having a thickness of 0.3 mm, the sheet and the copper foil were adhered and cured by heating under pressure with a hot pressing machine at a pressure of 5 MPa, at 120° C. for 30 minutes, then 150° C. for 30 minutes, and then 180° C. for 120 minutes. The measurement of peel strength from the copper foil was evaluated by 90° peeling in accordance with Japanese Industrial Standards (JIS) C6481: 1996. As a result, the peel strength was 1.7 N/mm.

From the above results, the cured product obtained by curing the composition of the present invention has excellent low dielectric properties and electrical insulation properties, exhibits a specific range of elastic modulus, heat resistance, and water resistance, and has sufficient strength (elastic modulus) for practical use at normal temperature and in high temperature range. In addition, the peel strength with the copper foil is also practically sufficient. Further, high peel strength with an LCP (liquid crystal polymer) sheet is exhibited under relatively mild conditions. The curable composition may be in a solid state moldable into a film, and exhibits thermoplasticity which allows the composition to be melted by heating below curing conditions, molded into various shapes, and cured. Therefore, molding into various shapes including a sheet is easily performed, and then curing may be performed by heating. The cured product may be suitably used as an electrically insulating material particularly for high frequencies. The cured product may be suitably used as electrically insulating material for thin films and an electrically insulating material for high frequencies. In particular, the composition of the present invention has a low content of monomer components, and may contain substantially no monomer component. The composition of the present invention may be used as a coverlay film, a solder resist film, a build-up film, a bonding sheet, a coverlay sheet, a bump sheet for flip chip bonders, an interlayer insulating agent, and an interlayer adhesive in an uncured state. The composition of the present invention may be used as a printed circuit board, a flexible printed circuit board, a CCL (copper clad laminate) or FCCL (flexible copper clad laminate) base material. Further, it may be used as an insulating layer for a substrate.

The invention claimed is:

1. A curable composition, comprising:
   an olefin-aromatic vinyl compound-aromatic polyene copolymer satisfying the following conditions (1) to (4); and
   an additive resin,
   wherein the additive resin is one or more selected from the group consisting of a hydrocarbon-based elastomer, an olefin-aromatic vinyl compound-aromatic polyene copolymerized oligomer, and an aromatic polyene-based resin, wherein the hydrocarbon-based elastomer is one or more selected from the group consisting of ethylene-based elastomer, propylene-based elastomer, 1,2-polybutadiene, and hydrides thereof, wherein the 1,2-polybutadiene is liquid at 25° C.:
   (1) a number average molecular weight of the copolymer is 5000 or more and 100000 or less;
   (2) the aromatic vinyl compound monomer is an aromatic vinyl compound having 8 or more and 20 or less carbon atoms, and a content of the aromatic vinyl compound monomer unit is 0 mass % or more and 70 mass % or less;
   (3) the aromatic polyene is one or more selected from polyenes having 5 or more and 20 or less carbon atoms and having a plurality of vinyl groups and/or vinylene groups in the molecule, and a content of the vinyl groups and/or the vinylene groups derived from a unit of the aromatic polyene is 1.5 pieces or more and less than 20 pieces per number average molecular weight; and
   (4) the olefin is one or more selected from olefins having 2 or more and 20 or less carbon atoms, and a total of units of the olefin monomer, the aromatic vinyl compound, and the aromatic polyene monomer is 100 mass %.

2. The curable composition according to claim 1, wherein the additive resin is contained in an amount of 1 to 500 parts by mass relative to 100 parts by mass of the copolymer.

3. The curable composition according to claim 1, wherein the additive resin is the 1,2-polybutadiene.

4. The curable composition according to claim 1, further comprising a monomer that is one or more selected from the group consisting of an aromatic vinyl compound monomer, an aromatic polyene monomer, and a polar monomer.

5. The curable composition according to claim 4, wherein the monomer is contained in an amount of 10 parts by mass or less relative to 100 parts by mass of the copolymer.

6. A curable composition in varnish form, comprising:
the curable composition according to claim 1; and
a solvent.

7. The curable composition according to claim 1, further comprising a curing agent.

8. The curable composition according to claim 1, further comprising one or more selected from the group consisting of a filler, a flame retardant, and a surface modifier.

9. A molded product comprising the curable composition according to claim 1.

10. The molded product according to claim 9, being a sheet.

11. A cured product of the curable composition according to claim 1.

12. The cured product according to claim 11, having a storage elastic modulus at 300° C. of $5 \times 10^5$ Pa or more.

13. The cured product according to claim 11, being an electrically insulating material.

14. A laminate, comprising:
a layer containing the curable composition according to claim 1; and
one or more selected from the group consisting of a copper foil and an LCP layer.

15. An electrically insulating material comprising a cured product of a composition,
wherein the composition comprises:
an olefin-aromatic vinyl compound-aromatic polyene copolymer satisfying the following conditions (1) to (4); and
an additive resin that is one or more selected from the group consisting of a hydrocarbon-based elastomer, an olefin-aromatic vinyl compound-aromatic polyene copolymerized oligomer, and an aromatic polyene-based resin, wherein the hydrocarbon-based elastomer is one or more selected from the group consisting of ethylene-based elastomer, propylene-based elastomer, 1,2-polybutadiene, and hydrides thereof, wherein the 1,2-polybutadiene is liquid at 25° C., and wherein the electrically insulating material has a storage elastic modulus at 300° C. of $5 \times 10^5$ Pa or more, and a dielectric constant of 2.5 or less and 2.0 or more and a dielectric tangent of 0.003 or less and 0.0005 or more at 23° C. and 10 GHz:

(1) a number average molecular weight of the copolymer is 5000 or more and 100000 or less;

(2) the aromatic vinyl compound monomer is an aromatic vinyl compound having 8 or more and 20 or less carbon atoms, and the content of the aromatic vinyl compound monomer unit is 0 mass % or more and 70 mass % or less;

(3) the aromatic polyene is one or more selected from polyenes having 5 or more and 20 or less carbon atoms and having a plurality of vinyl groups and/or vinylene groups in the molecule, and a content of the vinyl groups and/or the vinylene groups derived from a unit of the aromatic polyene is 1.5 pieces or more and less than 20 pieces per number average molecular weight; and (4) the olefin is one or more selected from olefins having 2 or more and 20 or less carbon atoms, and a total of units of the olefin monomer, the aromatic vinyl compound monomer, and the aromatic polyene monomer is 100 mass %.

* * * * *